(12) United States Patent
Hidaka

(10) Patent No.: US 7,110,288 B2
(45) Date of Patent: Sep. 19, 2006

(54) THIN FILM MAGNETIC MEMORY DEVICE HAVING REDUNDANT CONFIGURATION

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/038,064

(22) Filed: Jan. 21, 2005

(65) Prior Publication Data

US 2005/0122774 A1 Jun. 9, 2005

Related U.S. Application Data

(62) Division of application No. 10/316,082, filed on Dec. 11, 2002, now Pat. No. 6,876,576.

(30) Foreign Application Priority Data

Jun. 4, 2002 (JP) ............................. 2002-163135

(51) Int. Cl.
*G11C 11/14* (2006.01)
*G11C 11/00* (2006.01)
*G11C 29/00* (2006.01)
*G11C 7/02* (2006.01)

(52) U.S. Cl. .................... 365/171; 365/158; 365/200; 365/210; 365/225.5; 365/66

(58) Field of Classification Search ................ 365/158, 365/171, 173, 200, 209, 210
See application file for complete search history.

(56) References Cited

U.S. PATENT DOCUMENTS

| 5,031,151 A | * | 7/1991 | Fifield et al. ................ 365/195 |
| 5,523,974 A | * | 6/1996 | Hirano et al. ................ 365/200 |
| 5,652,725 A | | 7/1997 | Suma et al. |
| 5,687,330 A | | 11/1997 | Gist et al. |
| 5,751,626 A | * | 5/1998 | Seyyedy ..................... 365/145 |
| 6,246,622 B1 | * | 6/2001 | Sugibayashi ................ 365/210 |
| 6,314,032 B1 | | 11/2001 | Takase |
| 6,438,053 B1 | * | 8/2002 | Pochmuller .................. 365/210 |
| 6,473,336 B1 | | 10/2002 | Nakajima et al. |
| 6,549,455 B1 | | 4/2003 | Yamada |
| 6,563,743 B1 | | 5/2003 | Hanzawa et al. |
| 6,597,607 B1 | | 7/2003 | Koshita |
| 6,687,150 B1 | * | 2/2004 | Joachim et al. ............. 365/145 |

(Continued)

FOREIGN PATENT DOCUMENTS

DE 196 12 407 A1 11/1996

(Continued)

OTHER PUBLICATIONS

"A 10ns Read and Write Non-Volatile Memory Array Using a Magnetic Tunnel Junction and FET Switch in Each Cell", Scheuerlein et al., ISSCC Digest of Technical Papers, TA 7.2, Feb. 2000, pp. 94-95, 128-129, 409-410.

(Continued)

*Primary Examiner*—Amir Zarabian
*Assistant Examiner*—Ly Duy Pham
(74) *Attorney, Agent, or Firm*—McDermott Will & Emery LLP

(57) ABSTRACT

Normal memory cells are arranged in rows and columns, and dummy memory cells are arranged to form dummy memory cell rows by sharing memory cell columns with the normal memory cells. When there is at least one defect in the normal memory cells and/or the dummy memory cells, replacement/repair is carried out using a redundant column in a unit of memory cell column. The redundant column includes not only spare memory cells for repair of the normal memory cells but also spare dummy memory cells for repair of the dummy memory cells.

4 Claims, 18 Drawing Sheets

U.S. PATENT DOCUMENTS

| | | | |
|---|---|---|---|
| 6,865,099 B1* | 3/2005 | Tran et al. | 365/63 |
| 6,885,600 B1* | 4/2005 | Tran et al. | 365/205 |
| 2002/0008998 A1 | 1/2002 | Omura et al. | |
| 2002/0015332 A1* | 2/2002 | Rolandi et al. | 365/189.07 |
| 2002/0038878 A1 | 4/2002 | Itou | |
| 2002/0136053 A1* | 9/2002 | Asano et al. | 365/158 |
| 2003/0090935 A1 | 5/2003 | Hidaka | |
| 2003/0099130 A1 | 5/2003 | Hidaka | |
| 2003/0099144 A1 | 5/2003 | Kim et al. | |
| 2003/0112664 A1* | 6/2003 | Yamano | 365/189.07 |
| 2003/0223268 A1* | 12/2003 | Tanizaki et al. | 365/158 |

FOREIGN PATENT DOCUMENTS

| | | |
|---|---|---|
| DE | 102 48 221 A1 | 5/2003 |
| DE | 102 39 600 A1 | 6/2003 |
| JP | 2001-284456 A | 10/2001 |
| JP | 2001284456 A * | 10/2001 |

OTHER PUBLICATIONS

"Nonvolatile RAM based on Magnetic Tunnel Junction Elements", Durlam et al., ISSCC Digest of Technical Papers, TA 7.3, Feb. 2000, pp. 96-97, 130-131, 410-411.

"A 256kb 3.0V 1T1MTJ Nonvolatile Magnetoresistive RAM", Naji et al., ISSCC Digest of Technical Papers, TA7.6, Feb. 2001, pp. 94-95, 122-123, 404-405, 438.

U.S. Appl. No. 09/982,936, filed Oct. 22, 2001.

U.S. Appl. No. 10/153,737, filed May 24, 2002.

* cited by examiner

US 7,110,288 B2

THIN FILM MAGNETIC MEMORY DEVICE HAVING REDUNDANT CONFIGURATION

This application is a divisional of application Ser. No. 10/316,082 filed Dec. 11, 2002 now U.S. Pat. No. 6,876,576.

BACKGROUND OF THE INVENTION

1. Field of the Invention

The present invention relates to thin film magnetic memory devices, and more particularly to a thin film magnetic memory device provided with a redundant configuration.

2. Description of the Background Art

A magnetic random access memory (MRAM) device has attracted attention as a memory device capable of non-volatile data storage with low power consumption. The MRAM device stores data in a non-volatile manner using a plurality of thin film magnetic elements formed in a semiconductor integrated circuit, and permits random access to the respective thin film magnetic element.

In particular, it has recently been reported that provision of thin film magnetic elements having magnetic tunnel junctions (MTJ) as memory cells significantly improves the performance of the MRAM device. The MRAM device provided with such memory cells having magnetic tunnel junctions is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 17 is a schematic diagram showing a configuration of a memory cell having a magnetic tunnel junction (hereinafter, also simply referred to as the "MTJ memory cell").

Referring to FIG. 17, the MTJ memory cell includes a tunneling magneto-resistance element TMR having its electric resistance changing according to a level of stored data, and an access element ATR for forming a path of a sense current Is passing through tunneling magneto-resistance element TMR at the time of data read. Hereinafter, access element ATR is also referred to as an access transistor ATR, since it is typically formed of a field effect transistor. Access transistor ATR is coupled between tunneling magneto-resistance element TMR and a fixed voltage (ground voltage Vss).

A write word line WWL for designating data write, a read word line RWL for executing data read, and a bit line BL as a data line for transmitting an electric signal corresponding to a level of stored data at the time of the data read and the data write, are arranged for the MTJ memory cell.

FIG. 18 is a conceptual diagram illustrating a data read operation from the MTJ memory cell.

Referring to FIG. 18, tunneling magneto-resistance element TMR has a ferromagnetic layer (hereinafter, also simply referred to as the "fixed magnetic layer") FL having a fixed, constant direction of magnetization, and a ferromagnetic layer (hereinafter, also simply referred to as the "free magnetic layer") VL magnetized in a direction corresponding to the magnetic field externally applied. A tunneling barrier (tunneling film) TB formed of an insulating film is provided between fixed magnetic layer FL and free magnetic layer VL. Free magnetic layer VL is magnetized in a direction the same as or opposite to fixed magnetic layer FL in accordance with the level of the stored data to be written. Fixed magnetic layer FL, tunneling barrier TB and free magnetic layer VL form a magnetic tunnel junction.

At the time of data read, access transistor ATR turns on in response to activation of read word line RWL. This allows a sense current Is to flow through a current path from bit line BL via tunneling magneto-resistance element TMR and access transistor ATR to ground voltage Vss.

The electric resistance of tunneling magneto-resistance element TMR changes in accordance with the relative relation between the magnetization directions of fixed magnetic layer FL and free magnetic layer VL. Specifically, when the magnetization direction of fixed magnetic layer FL and the magnetization direction of free magnetic layer VL are the same (parallel), the electric resistance of tunneling magneto-resistance element TMR becomes small compared to the case where the two layers have opposite (anti-parallel) magnetization directions.

Thus, when free magnetic layer VL is magnetized in a direction according to the stored data, voltage change occurring in tunneling magneto-resistance element TMR due to sense current Is will differ in accordance with the level of the stored data. Accordingly, if sense current Is is passed through tunneling magneto-resistance element TMR after precharging of bit line BL to a certain voltage, for example, then the stored data in a MTJ memory cell can be read by sensing the voltage of bit line BL.

FIG. 19 is a conceptual diagram illustrating a data write operation to the MTJ memory cell.

Referring to FIG. 19, at the time of data write, read word line RWL is inactivated, and access transistor ATR is turned off. In this state, a data write current for magnetizing free magnetic layer VL to a direction in accordance with the write data is passed through write word line WWL and through bit line BL. The magnetization direction of free magnetic layer VL is determined by the data write currents flowing through the respective lines of write word line WWL and bit line BL.

FIG. 20 is a conceptual diagram illustrating a relation between the data write current at the time of data write to the MTJ memory cell and the magnetization direction of the tunneling magneto-resistance element.

Referring to FIG. 20, the horizontal axis H (EA) represents the magnetic field applied to free magnetic layer VL within tunneling magneto-resistance element TMR in an easy-to-magnetize, or, easy axis (EA) direction. The vertical axis H (HA) represents the magnetic field acting on free magnetic layer VL in a hard-to-magnetize, or, hard axis (HA) direction. Magnetic fields H (EA) and H (HA) correspond respectively to two magnetic fields generated by the currents flowing through bit line BL and write word line WWL.

In the MTJ memory cell, the fixed magnetization direction of fixed magnetic layer FL is along the easy axis of free magnetic layer VL. Free magnetic layer VL is magnetized in the parallel (same) or anti-parallel (opposite) direction with respect to fixed magnetic layer FL along the easy axis direction, in accordance with the level ("1" or "0") of the stored data. Hereinafter, the electric resistances of tunneling magneto-resistance element TMR corresponding to the two magnetization directions of free magnetic layer VL will be referred to as R1 and R0 (R1>R0). The MTJ memory cell can store data of one bit ("1" or "0") corresponding to respective one of the two magnetization directions of free magnetic layer VL.

The magnetization direction of free magnetic layer VL can be rewritten only in the case where the sum of applied magnetic fields H (EA) and H (HA) reaches a region outside the asteroid characteristic line shown in FIG. 20. In other words, the magnetization direction of free magnetic layer VL would not change if the applied data write magnetic field has an intensity corresponding to the region inside the asteroid characteristic line.

As seen from the asteroid characteristic line, a magnetization threshold value necessary to change the magnetization direction along the easy axis can be lowered by applying to free magnetic layer VL the magnetic field in the hard axis direction.

Assume that operating points at the time of data write are designed as in the example shown in FIG. 20. In this case, in the MTJ memory cell to which data is to be written, the data write magnetic field in the easy axis direction is designed to have an intensity of $H_{WR}$. In other words, the value of the data write current to be passed through bit line BL or write word line WWL is designed such that the relevant data write magnetic field $H_{WR}$ is obtained. In general, data write magnetic field $H_{WR}$ is expressed by the sum of a switching magnetic field $H_{SW}$ necessary to switch the magnetization direction and a margin $\Delta H$: $H_{WR}=H_{SW}+\Delta H$.

To rewrite the stored data of the MTJ memory cell, or, the magnetization direction of tunneling magneto-resistance element TMR, a data write current of at least a prescribed level should be passed through both write word line WWL and bit line BL. By doing so, free magnetic layer VL in tunneling magneto-resistance element TMR can be magnetized in the same (parallel) or opposite (anti-parallel) direction with respect to fixed magnetic layer FL, in accordance with the direction of the data write magnetic field along the easy axis (EA). The magnetization direction once written into tunneling magneto-resistance element, i.e., the stored data of the MTJ memory cell, is held in a non-volatile manner until new data is written.

As such, the electric resistance of tunneling magneto-resistance element TMR changes according to the magnetization direction that is rewritable with the data write magnetic field being applied. Thus, by making the two magnetization directions of free magnetic layer VL in tunneling magneto-resistance element TMR correspond to the levels ("1" and "0") of the stored data, the data can be stored in a non-volatile manner.

In the MRAM device, data is read utilizing an electric resistance difference $\Delta R=(Rmax-Rmin)$ that is a junction resistance difference in tunneling magneto-resistance element TMR corresponding to the difference of the stored data levels. In other words, data read is performed by sensing a current passing through a selected memory cell, i.e., sense current Is.

Generally, in addition to the normal MTJ memory cells for use in data storage, dummy memory cells are provided for comparison with the selected memory cell. The dummy memory cells need to be fabricated such that they each have an electric resistance of an intermediate level between the two electric resistances Rmax and Rmin corresponding to the stored data levels of the MTJ memory cell. Implementation of such an electric resistance requires special design and fabrication of the dummy memory cells. If the dummy memory cells do not have electric resistance values as designed, data read margin would be impaired.

Further, generally in a memory device, in addition to provision of a plurality of normal memory cells being selected with address signals, a redundant configuration for repair of defects in the normal memory cells is provided to improve manufacturing yield. In the redundant configuration, replacement/repair of the defective memory cells is conducted in units of sections, using spare memory cells additionally provided.

In the redundant configuration in the MRAM device, it is necessary to make it possible to replace/repair not only the normal MTJ memory cells but also the dummy memory cells. In other words, the spare memory cells should be arranged efficiently, taking account of replacement of the dummy memory cells as well as the normal memory cells.

SUMMARY OF THE INVENTION

An object of the present invention is to provide a thin film magnetic memory device provided with a redundant configuration permitting efficient replacement/repair of both normal MTJ memory cells provided for data storage and dummy memory cells provided for comparison with the normal MTJ memory cells at the time of data read.

In brief, the present invention is a thin film magnetic memory device including a plurality of memory cells, a plurality of dummy memory cells, a data read circuit, and a redundant unit. The plurality of memory cells are arranged in rows and columns, and each memory cell has an electric resistance in accordance with magnetically written data. The plurality of dummy memory cells each have a prescribed electric resistance, and are arranged such that they share one of the rows and columns with the plurality of memory cells and form the other of the rows and columns. The data read circuit performs data read based on an electric resistance difference between selected one of the plurality of memory cells and one of the plurality of dummy memory cells. The redundant unit is for replacing a defective memory cell included in the plurality of memory cells and the plurality of dummy memory cells in a unit of the one of the row and column. The redundant unit includes a plurality of first spare memory cells and at least one second spare memory cell arranged to form the one of the row and column. The plurality of first spare memory cells are arranged such that they share the other of the rows and columns with the plurality of memory cells for replacement of the defective memory cell included in the plurality of memory cells. The second spare memory cell is arranged such that it shares the other of the row and column with the plurality of dummy memory cells for replacement of the defective memory cell included in the plurality of dummy memory cells.

Accordingly, the main advantage of the present invention is that defects in not only the normal memory cells but also the dummy memory cells can be replaced/repaired in a unit of memory cell column by the redundant unit including both the first and second spare memory cells, since the dummy memory cells are arranged in a direction that is different from the direction in which the first and second spare memory cells are arranged. That is, it is possible to reduce the layout area of the first and second spare memory cells and to downsize the memory array.

According to another aspect of the present invention, the thin film magnetic memory device includes a plurality of memory cells, a plurality of dummy memory cells, a resistance adjusting portion, a data read circuit, and a redundant unit. The memory cells are arranged in rows and columns, and each memory cell has an electric resistance in accordance with magnetically written data. The dummy memory cells each have the same electric resistance characteristic as each memory cell, and data of a prescribed level is written in advance therein. The dummy memory cells each share one of the row and column with the memory cells, and form the other of the row and column. The resistance adjusting portion electrically couples a prescribed electric resistance to at least one of the memory cell and the dummy memory cell. The data read circuit performs data read based on a difference between combined resistance of selected one of the plurality of memory cells and the resistance adjusting portion and combined resistance of one of the plurality of dummy memory cells and the resistance adjusting portion. The redundant unit is for replacement of a defective memory cell included in the memory cells and the dummy memory cells in a unit of the other of the row and column. The redundant unit includes a plurality of spare memory cells arranged in the other of the row and column such that they share the one of the rows and columns with the memory cells and the dummy memory cells. Each spare memory cell has the same electric resistance characteristic as each memory cell.

In the memory array configuration having dummy memory cells of the same configurations as memory cells arranged therein, the thin film magnetic memory device of the present aspect permits replacement/repair of both the defective memory cells and the defective dummy memory cells in a unit of row or column, using a single redundant unit formed of the spare memory cells. Further, since the dummy memory cells each have the same configuration and shape as the memory cell, special design or manufacturing steps are unnecessary for fabrication of the dummy memory cells. Therefore, an increase of chip area due to complication of the structure, degradation of process margin of the memory array and other problems are prevented.

According to a further aspect of the present invention, the thin film magnetic memory device permitting parallel input/output of data of m bits (m is an integer not less than 2) includes a plurality of blocks, m data terminals, and a shift redundancy circuit. Each of the plurality of blocks includes a plurality of memory cells arranged in rows and columns, and a plurality of dummy memory cells arranged such that they share the columns with the plurality of memory cells and form dummy memory cell rows. Each memory cell has an electric resistance in accordance with magnetically written data. Each dummy memory cell has a prescribed electric resistance. Each block further includes (m+1) memory cell columns formed of the memory cells and the dummy memory cells, and (m+1) data line pairs each formed of complementary first and second data lines and provided corresponding to the (m+1) memory cell columns. Each of the first and second data lines is connected to one and the other of one memory cell and one dummy memory cell belonging to corresponding one of the (m+1) memory cell columns at the time of data read from corresponding one of the plurality of blocks. The m data terminals are provided for sending data to and receiving data from the outside. The shift redundancy circuit is provided, when there is a defect in at least one of the memory cells and the dummy memory cells in a selected block, for reading and writing the data sent/received by the m data terminals using the m data line pairs other than the data line pair connected to the defect in the selected block.

The relevant thin film magnetic memory device can replace/repair defects in both the memory cells and the dummy memory cells in a unit of memory cell column, for each block readable/writable data of multiple bits in parallel, by performing shift redundancy using the memory cell columns including the one additionally provided. Accordingly, the redundant configuration becomes more efficient in the memory array configuration where multiple bits are input/output in parallel.

According to yet another aspect of the present invention, the thin film magnetic memory device includes a plurality of memory cells, a plurality of dummy memory cells, first and second data lines, a data read circuit, and a dummy reference potential generating portion. The memory cells each have an electric resistance in accordance with magnetically written data. The dummy memory cells each have a prescribed electric resistance. The first and second data lines are supplied with prescribed data read currents, and are connected respectively to one and the other of one of the plurality of memory cells and one of the plurality of dummy memory cells in a normal data read operation. The data read circuit performs data read based on a voltage difference between the first and second data lines. When one of the first and second data lines is connected to one of the plurality of dummy memory cells in a test operation, the dummy reference potential generating portion is connected to the other of the first and second data lines instead of one of the plurality of memory cells. The dummy reference potential generating portion applies to the other of the first and second data lines a potential that is different from a potential of the one of the first and second data lines to which the prescribed electric resistance is connected.

In the relevant thin film magnetic memory device, the data read circuit used in the normal operation can also be used in the test operation to detect defects in the dummy memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings.

First Embodiment

Figure 1:
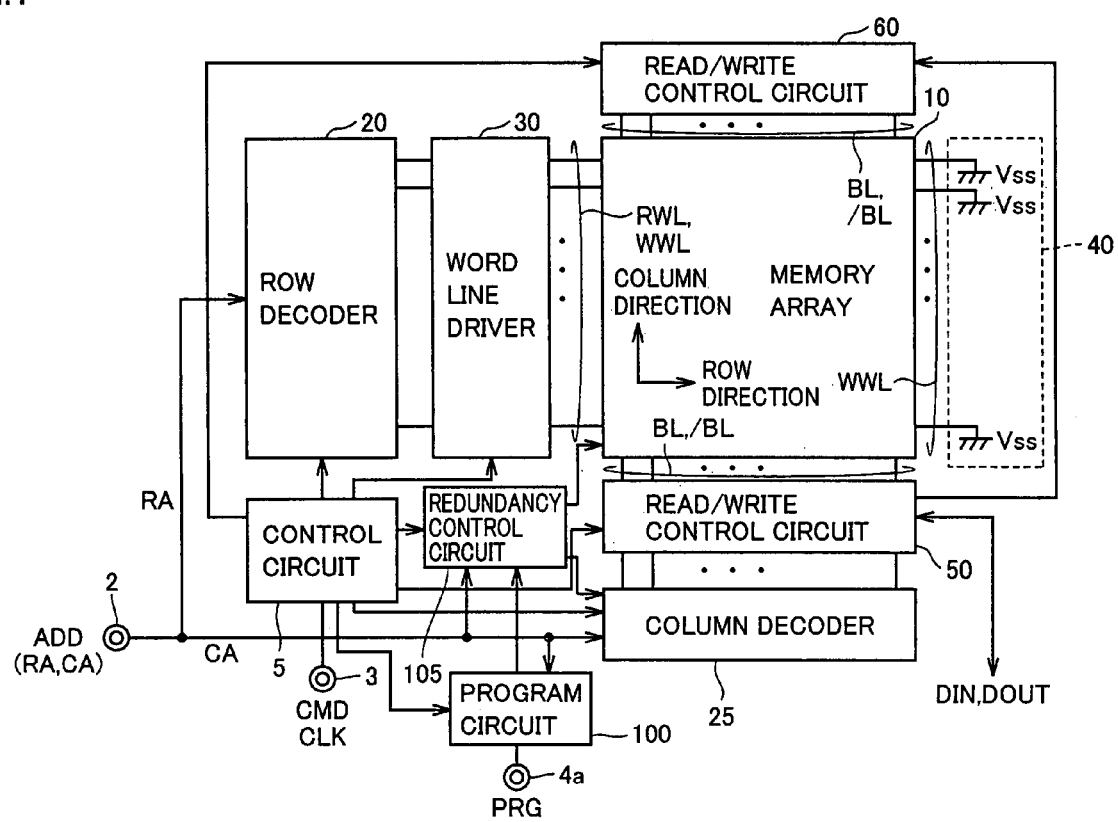
FIG. 1 is a schematic block diagram showing the entire configuration of an MRAM device according to a first embodiment of the present invention.

Referring to FIG. 1, the MRAM device 1 according to the first embodiment of the present invention performs random access in accordance with externally applied control signal CMD and address signal ADD, and performs input of write data DIN and output of read data DOUT. The data read operation and the data write operation in MRAM device 1 are performed at timings in synchronization with an externally applied clock signal CLK, for example. Alternatively, the operating timings may be determined within the device, unprovided with external clock signal CLK.

MRAM device 1 includes: an address terminal 2 receiving input of address signal ADD; a control signal terminal 3 receiving input of control signal CMD and clock signal CLK; a signal terminal 4a receiving input of a program signal PRG that is activated in a program operation; a control circuit 5 for controlling the entire operations of MRAM device 1 in response to control signal CMD and clock signal CLK; and a memory array 10 having a plurality of MTJ memory cells arranged in rows and columns.

Memory array 10, whose configuration will be described later in detail, includes: a plurality of normal MTJ memory cells (hereinafter, also simply referred to as "normal memory cells") arranged in rows and columns that are selectable by address signal ADD; a plurality of dummy memory cells provided for comparison with the normal memory cell selected as an access target (hereinafter, also referred to as the "selected memory cell") in a data read operation; and a redundant circuit (not shown) for replacing/repairing the normal memory cell(s) and/or the dummy memory cell(s) suffering defect(s) (hereinafter, also commonly referred to as the "defective memory cell(s)") in a unit of prescribed redundancy repair section. Generally, the unit of redundancy repair section is a row, a column, or a data I/O line, in which case, the redundant circuit corresponds to a redundant row, a redundant column, or a redundant block corresponding to a spare I/O line, respectively.

The dummy memory cells are arranged to share one of the rows and columns with the normal memory cells. Hereinafter, both the row formed only of the normal memory cells and the row shared by the normal and dummy memory cells are generally called the "memory cell rows". Similarly, both the column formed only of the normal memory cells and the column shared by the normal and dummy memory cells are generally called the "memory cell columns".

A plurality of write word lines WWL and read word lines RWL are arranged corresponding to the respective memory cell rows. Complementary bit lines BL and /BL constituting bit line pairs are arranged corresponding to the respective memory cell columns.

MRAM device 1 further includes a row decoder 20, a column decoder 25, a word line driver 30, and read/write control circuits 50, 60.

Row decoder 20 performs row selection in memory array 10 in accordance with a row address RA indicated by address signal ADD. Column decoder 25 performs column selection in memory array 10 in accordance with a column address CA indicated by address signal ADD. Word line driver 30 selectively activates read word line RWL or write word line WWL based on the row selection result of row decoder 20. Row address RA and column address CA indicate a selected memory cell that is selected as a target of data read or data write.

Write word line WWL is coupled to a ground voltage Vss in a region 40 on the other side of memory array 10 from a region where word line driver 30 is arranged. Read/write control circuits 50, 60 collectively represent circuit groups arranged adjacent to memory array 10 for making a data write current and a sense current (data read current) pass through bit lines BL and /BL of a memory cell column corresponding to the selected memory cell (hereinafter, also referred to as the "selected column").

MRAM device 1 further includes a program circuit 100 and a redundancy control circuit 105. Program circuit 100 holds, in a non-volatile manner, defective addresses for specifying defective memory cells as program information. The defective addresses correspond to the row addresses indicating memory cell rows having the defective memory cells therein (hereinafter, also referred to as the "defective rows") and/or the column addresses indicating memory cell columns having the defective memory cells therein (hereinafter, also referred to as the "defective columns").

These defective addresses are read out based on a designation from control circuit 5 and transmitted to redundancy control circuit 105, in the data write and read operations where accesses should be made based on address signal ADD. Redundancy control circuit 105 performs matching/comparison between the defective addresses transmitted from program circuit 100 and address signal ADD input to the address terminal. Alternatively, the functions of program circuit 100 and redundancy control circuit 105 may be incorporated in row decoder 20 or column decoder 25.

Hereinafter, a configuration for redundancy repair according to the first embodiment is described wherein a redundant column is used for replacement in a unit of memory cell column.

Figure 2:
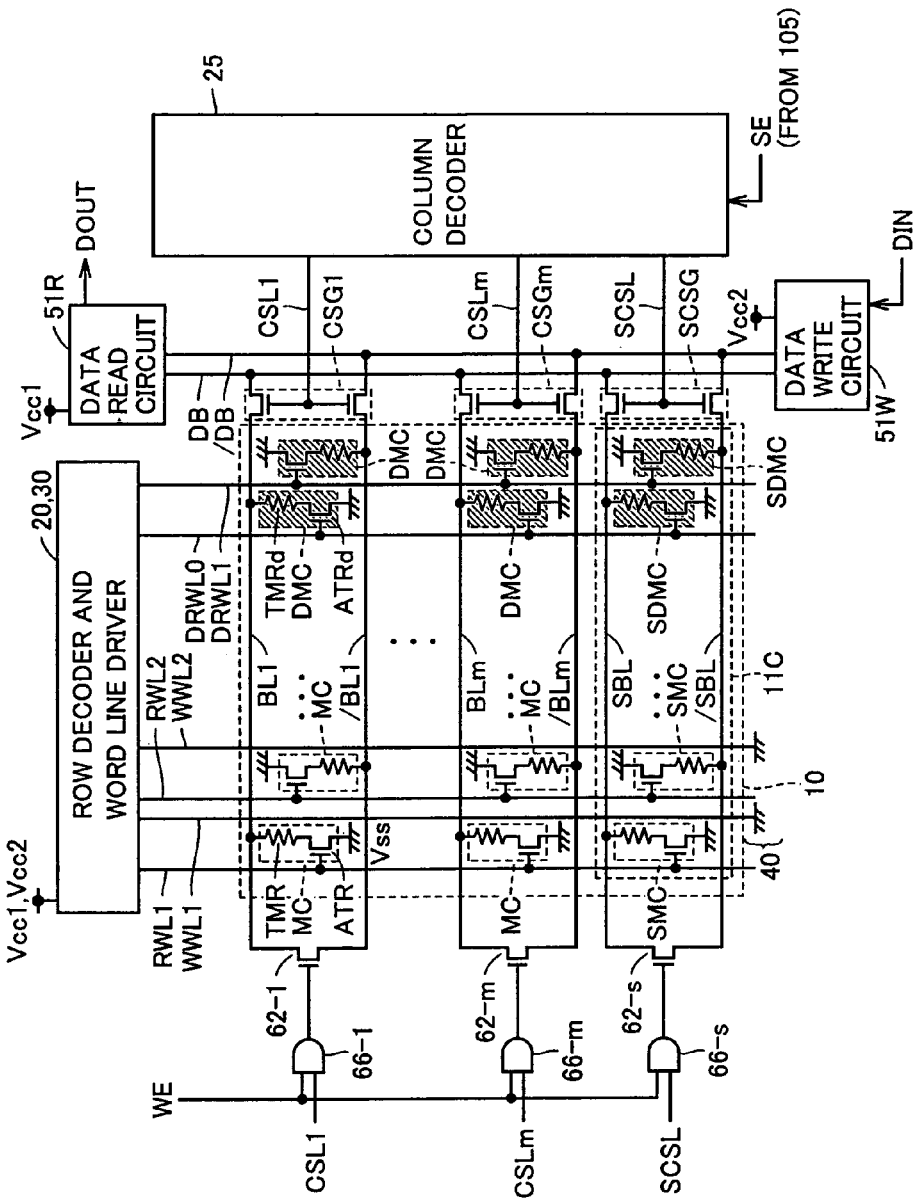
FIG. 2 is a circuit diagram illustrating a configuration of the memory array according to the first embodiment.
Figure 17:
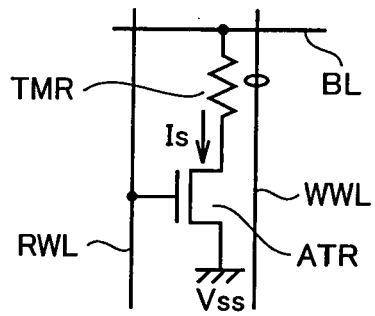
FIG. 17 is a schematic diagram showing a configuration of an MTJ memory cell.

Referring to FIG. 2, memory array 10 includes a plurality of memory cells MC arranged in rows and columns, a plurality of dummy memory cells DMC, and a redundant column 11C. The configuration of each normal memory cell MC is the same as described in conjunction with FIG. 17, and its electric resistance is set to either Rmax or Rmin in accordance with the magnetically written data.

Dummy memory cells DMC are arranged in the row direction such that they share memory cell columns with normal memory cells MC and form two dummy memory cell rows. Each dummy memory cell DMC has a dummy resistance element TMRd and a dummy access transistor ATRd. Dummy memory cell DMC has a prescribed electric resistance when selected, i.e., when its dummy access transistor ATRd is on. Specifically, the electric resistance of the dummy memory cell when selected is set to an intermediate level of two kinds of electric resistances Rmax and Rmin of the normal memory cell, preferably to Rmin+ΔR/2.

To achieve dummy memory cell DMC having such characteristics, for example, dummy resistance element TMRd is first designed the same as tunneling magneto-resistance element TMR of normal memory cell MC, and stored data corresponding to electric resistance Rmin is prewritten therein. The transistor size of dummy access transistor ATRd is then differentiated from that of access transistor ATR, or the electric resistance of dummy resistance element TMRd is set to a specific value. Data write in a normal operation is not performed on dummy memory cell DMC, since its electric resistance should be maintained at a prescribed value.

Redundant column 11C has spare memory cells SMC and spare dummy memory cells SDMC arranged in the column direction. Spare memory cells SMC each have the configuration and characteristics the same as those of normal memory cell MC, and are arranged to share memory cell rows with normal memory cells MC. Spare dummy memory cells SDMC, each having the same configuration and characteristics as dummy memory cell DMC, are arranged to share dummy memory cell rows with dummy memory cells DMC.

In memory array 10, read word lines RWL and write word lines WWL are arranged corresponding to a plurality of memory cell rows shared by normal memory cells MC and spare memory cells SMC. Dummy read word lines DRWL0 and DRWL1 are provided corresponding to the two dummy memory cell rows shared by dummy memory cells DMC and spare dummy memory cells SDMC. Thus, normal memory cells MC and spare memory cell SMC belonging to the same memory cell row are selected by common read word line RWL (in the data read operation) and common write word line WWL (in the data write operation), and dummy memory cells DMC and spare dummy memory cell SDMC belonging to the same dummy memory cell row are selected by common dummy read word line DRWL0 or DRWL1 in the data read operation.

Further, complementary bit lines BL and /BL are arranged corresponding to each of m memory cell columns (m is a natural number) shared by normal memory cells MC and dummy memory cells DMC. Complementary spare bit lines SBL and /SBL are provided corresponding to redundant column 11C.

Hereinafter, write word lines, read word lines and bit lines will be collectively represented as WWL, RWL and BL (/BL), while specific write word lines, read word lines and bit lines will be represented as WWL1, RWL1 and BL1 (/BL1), for example, with accompanying numerals. The high voltage state (power supply voltages Vcc1, Vcc2) and low voltage state (ground voltage Vss) of signals and signal lines will also be simply referred to as an "H level" and an "L level", respectively.

Normal memory cells MC in every other row are connected to either one of bit lines BL and /BL. For example, focusing on the normal memory cells belonging to the first memory cell column, the normal memory cell in the first row is coupled to bit line BL1, and the normal memory cell in the second row is coupled to bit line /BL1. Likewise, the normal memory cells and spare memory cells in the odd rows are connected to bit lines BL1–BLm, and those in the even rows are connected to the other bit lines /BL1–/BLm.

Dummy memory cells DMC are arranged in two rows x m columns, the two rows corresponding to dummy read word lines DRWL0 and DRWL1. The dummy memory cells selected by dummy read word line DRWL0 are coupled to respective bit lines BL1–BLm. The remaining dummy memory cells selected by dummy read word line DRWL1 are coupled respectively to bit lines /BL1–/BLm.

As in normal memory cells MC, spare memory cells SMC in odd rows are connected to spare bit line SBL, and those in even rows are connected to spare bit line /SBL. Likewise, spare dummy memory cells SDMC selected by respective dummy read word lines DRWL0 and DRWL1 are connected to spare bit lines SBL and /SBL, respectively.

Although read word lines RWL1, RWL2, write word lines WWL1, WWL2, bit lines BL1, /BL1, BLm /BLm corresponding to the first and m-th memory cell columns and the first and second memory cell rows have been shown representatively in FIG. 2, the similar configurations are provided for the remaining memory cell columns and memory cell rows.

In the data read operation, word line driver 30 selectively activates read word lines RWL and dummy read word lines DRWL0, DRWL1 to an H level (of power supply voltage Vcc1) in accordance with the row selection result. Specifically, when an odd row is selected and normal memory cells MC and spare memory cell SMC in the selected row are connected to bit lines BL1–BLm and spare bit line SBL, then dummy read word line DRWL1 is also activated, and corresponding dummy memory cells DMC and spare dummy memory cell SDMC are connected to bit lines /BL1–/BLm and spare bit line /SBL. By comparison, when an even row is selected, dummy read word line DRWL0 is activated in addition to the read word line of the selected row.

In the data write operation, word line driver 30 couples an end of write word line WWL of the selected row to power supply voltage Vcc2. This permits a data write current Ip to flow on write word line WWL of the selected row in the row direction from word line driver 30 toward region 40. The write word lines of non-selected rows are coupled to ground voltage Vss by word line driver 30.

Column select lines CSL1–CSLm for performing column selection are provided corresponding to respective memory cell columns. A spare column select line SCSL is also arranged corresponding to redundant column 11C. Column decoder 25 selectively activates (to an H level) one of column select lines CSL1–CSLm and spare column select line SCSL at each time of data write and data read in accordance with a decoded result of column address CA, i.e., the column selection result. The column selection will be described later in detail.

Further, complementary data buses DB and /DB are arranged in a peripheral portion of memory array 10. Read/write control circuit 50 shown in FIG. 1 includes: a data write circuit 51W, a data read circuit 51R, column select gates CSG1–CSGm provided corresponding to respective memory cell columns, and a spare column select gate SCSG provided corresponding to redundant column 11C. Hereinafter, column select lines CSL1–CSLm and column select gates CSG1–CSGm are also simply referred to as column select line CSL and column select gate CSG collectively.

Each column select gate CSG has a transistor switch electrically coupled between data bus DB and corresponding bit line BL, and a transistor switch electrically coupled between data bus /DB and corresponding bit line /BL. The transistor switches turn on/off in accordance with a voltage of corresponding column select line CSL. That is, each column select gate CSG, when corresponding column select line CSL is activated to a selected state (of an H level), electrically couples data buses DB and /DB with corresponding bit lines BL and /BL, respectively.

Spare column select gate SCSG has the same configuration as column select gate CSG. It electrically couples spare bit lines SBL and /SBL with data buses DB and /DB when spare column select line SCSL is activated to a selected state (of an H level).

The column select operation in MRAM device 1 is now described. The column select operation includes redundancy control for replacement/repair of the defective column(s).

Figure 3:
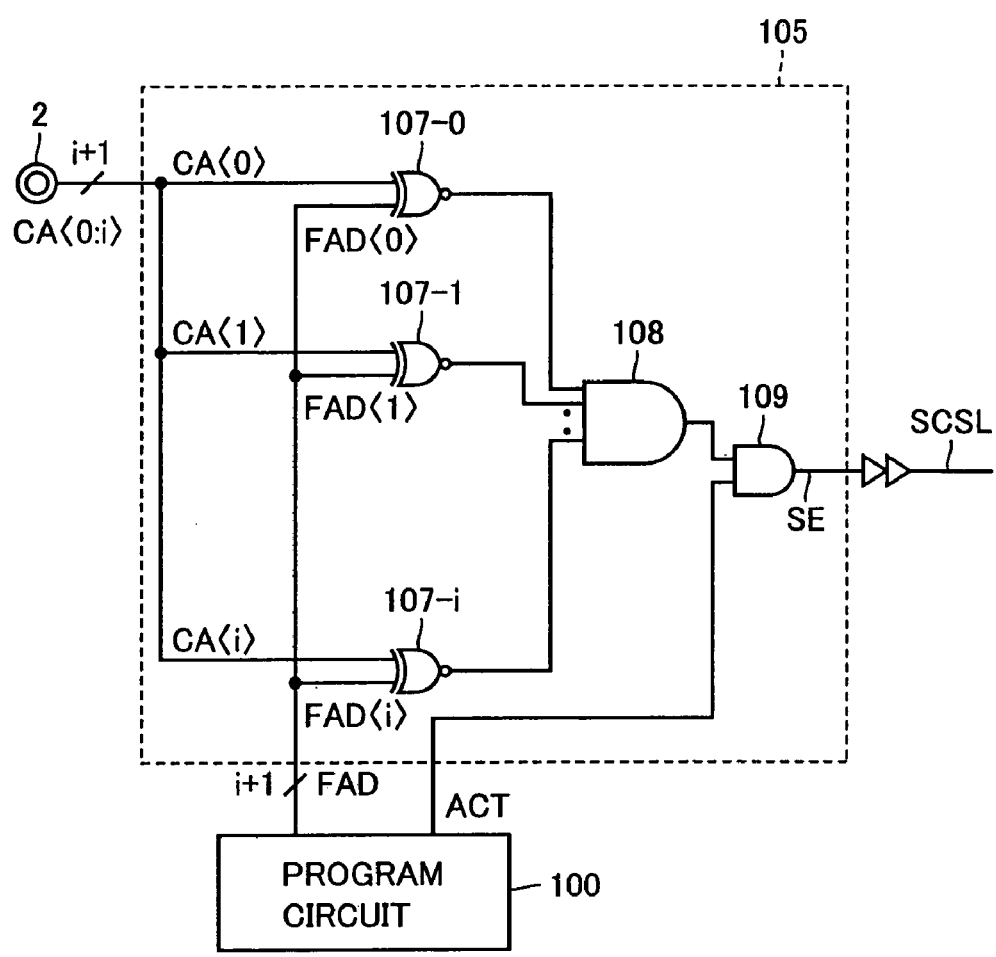
FIG. 3 is a block diagram showing a configuration of the redundancy control circuit shown in FIG. 1.

FIG. 3 is a block diagram showing a configuration of redundancy control circuit 105 shown in FIG. 1. In FIG. 3, it is assumed by way of example that a defective address FAD is formed of (i+1) bits (i is a natural number) indicating a defective column including defective memory cell(s) in at least one of normal memory cells MC and dummy memory cells DMC. Defective address FAD is represented as FAD<0>, for example, to specify one of the bits. A plurality of defective address bits are represented as FAD<0:i>, for example, to collectively represent FAD<0> to FAD<i>. Herein, other signals formed of a plurality of bits, such as column address CA and row address RA, are represented in the same manner.

Referring to FIG. 3, address terminal 2 receives a column address CA including column address bits CA<0> to CA<i> comparable with defective address bits FAD<0:i>.

Redundancy control circuit 105 includes matching/comparing gates 107-0 to 107-i provided corresponding to column address bits CA<0> to CA<i>, and logic gates 108 and 109. Program circuit 100 provides redundancy control circuit 105 with defective address FAD formed of defective address bits FAD<0:i> and a redundant column activating signal ACT. Redundant column activating signal ACT is set to an H level, based on the information stored in program circuit 100 in a non-volatile manner, when use of the redundant column is designated for replacement/repair of the defective memory cell(s). When there is no defective memory cell in the normal memory cells and the dummy memory cells, redundant column activating signal ACT is maintained at an L level.

Matching/comparing gates 107-0 to 107-i match/compare column address CA<0:i> with defective address FAD<0:i>. For example, matching/comparing gate 107-0 compares column address bit CA<0> with defective address bit FAD<0>, and outputs a signal of an H level when they match with each other, and outputs a signal of an L level when they mismatch. Logic gate 108 outputs an AND operation result of the outputs of matching/comparing gates 107-0 to 107-i. Logic gate 109 performs an AND operation of the output of logic gate 108 and the redundant column activating signal ACT from program circuit 100, and outputs the result as a spare enable signal SE.

Thus, the output of logic gate 108 is set to an H level when column address bits CA<0:i> and defective address bits FAD<0:i>, or column address CA and defective address FAD, completely match with each other. Spare enable signal SE output from logic gate 109 is set to an H level when use of the redundant column is designated and defective address FAD and column address CA match with each other.

Although not shown, an inverse signal of spare enable signal SE is transmitted to column decoder 25 as a normal enable signal. When the normal enable signal is set to an H level, column decoder 25 activates one of column select lines CSL1–CSLm to an H level based on column address CA, and inactivates spare column select line SCSL to an L level. On the contrary, when the normal enable signal is set to an L level, column decoder 25 activates spare column select line SCSL to an H level in response to spare enable signal SE, and inactivates each column select line CSL1–CSLm to an L level.

Referring again to FIG. 2, for each memory cell column, a transistor switch 62 for short-circuiting the other ends of corresponding bit lines BL and /BL, and a control gate 66 for controlling on/off of transistor switch 62 are provided. In FIG. 2, transistor switches 62-1 and 62-m corresponding to bit lines BL1, /BL1 and BLm, /BLm, and corresponding control gates 66-1 and 66-m are shown representatively. Each transistor switch 62 has a gate receiving the output of corresponding control gate 66. Each control gate 66 outputs an AND operation result of a voltage level of column select line CSL of the corresponding memory cell column and a control signal WE activated to an H level in the data write operation.

The similar configuration is provided for redundant column 11C. Specifically, a transistor switch 62-s is provided between the other ends of spare bit lines SBL and /SBL, and the gate of transistor switch 62-s receives an output of a control gate 66-s. Control gate 66-s outputs an AND operation result of the voltage levels of spare column select line SCSL and control signal WE.

Thus, in the data write operation, the ends of bit lines BL and /BL in a selected column corresponding to column address CA or the ends of spare bit lines SBL and /SBL in redundant column 11C are electrically coupled to each other by transistor switch 62.

Further, each bit line BL, /BL and each spare bit line SBL, /SBL are precharged to a ground voltage Vss by a precharge switch (not shown) in an active period of MRAM device 1, at least in a prescribed time period before the start of data read. During the data read operation and data write operation in the active period of MRAM device 1, the precharge switch is turned off, and each bit line BL, /BL and each spare bit line SBL, /SBL are separated from ground voltage Vss (precharge voltage).

Figure 4:
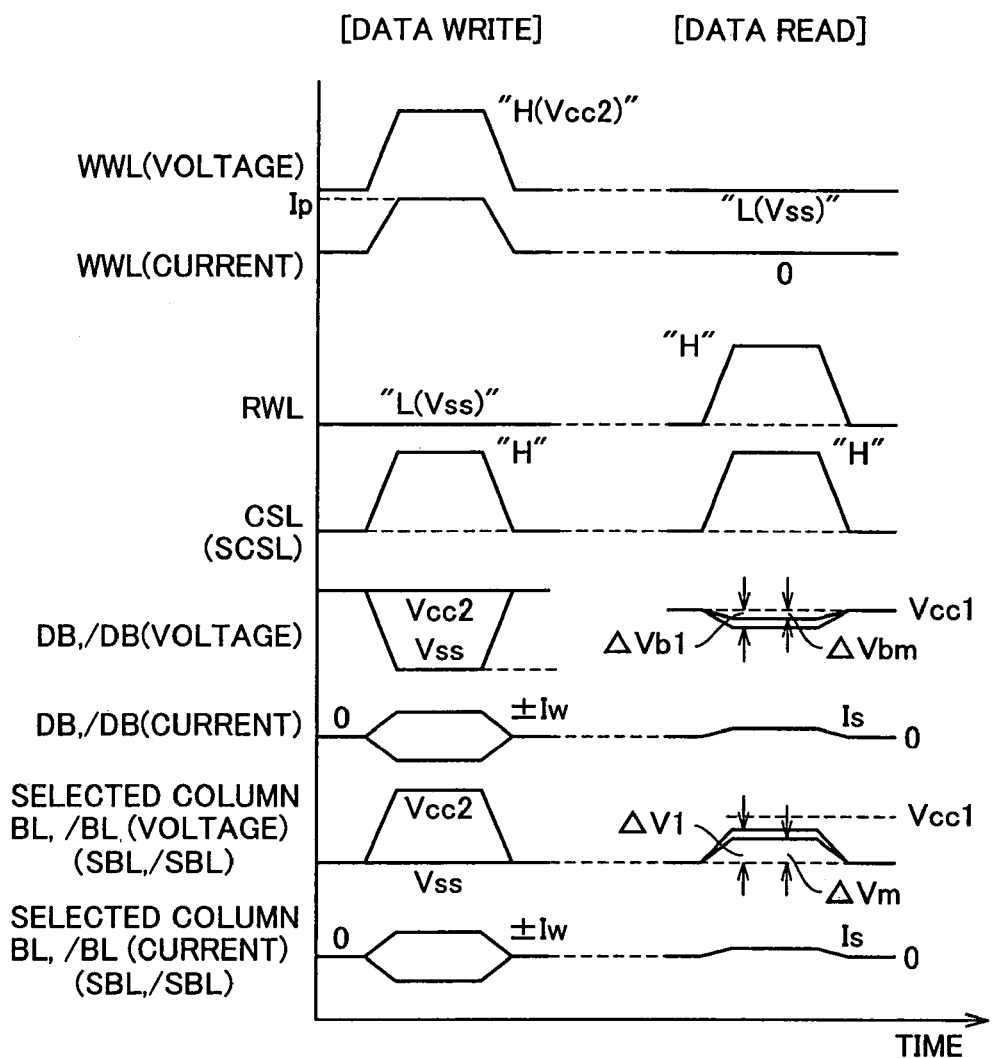
FIG. 4 shows operating waveforms in the data read operation and data write operation to illustrate replacement/repair in the MRAM device.

FIG. 4 shows operating waveforms during the data read operation and data write operation to illustrate replacement/repair in the MRAM device.

Firstly, the operation at the time of data read is described. Word line driver 30, in accordance with a result of row selection of row decoder 20, activates and connects write word line WWL corresponding to the selected row to power supply voltage Vcc2. Thus, a data write current Ip is passed through write word line WWL of the selected row in a direction from word line driver 30 toward region 40. The data write current is not passed through write word line WWL of a non-selected row, as it is maintained in an inactive state (L level: ground voltage Vss).

When column address CA and defective address FAD mismatch, column select line CSL of the selected row is activated to a selected state (H level), and one ends of bit lines BL and /BL of the selected column are coupled to data buses DB and /DB, respectively. Further, corresponding transistor switch 62 turns on, and the other ends (opposite from the column select gate CSG side) of bit lines BL and /BL of the selected column are short-circuited.

When column address CA and defective address FAD match, spare column select line SCSL is activated to a selected state (H level), and one ends of corresponding spare bit lines SBL and /SBL, instead of bit lines BL and /BL of the selected column, are coupled to data buses DB and /DB, respectively. Further, transistor switch 62-s turns on and short-circuits the other ends (opposite from the spare column select gate SCSG side) of the spare bit lines SBL and /SBL.

Data write circuit 51W sets data buses DB and /DB to one and the other of power supply voltage Vcc2 (H level) and ground voltage Vss (L level). For example, when write data DIN has a data level of L level, a data write current −Iw for writing of L level data is passed through data bus DB. Data write current −Iw is supplied to bit line BL of the selected column or to spare bit line SBL via column select gate CSG or spare column select gate SCSG.

Data write current −Iw passed through bit line BL of the selected column or spare bit line SBL is turned or folded back by the corresponding transistor switch 62 having turned on. Thus, a data write current +Iw in the opposite direction is passed through the other bit line /BL or spare bit line /SBL. Data write current +Iw flowing through bit line /BL or spare bit line/SBL is transmitted to data bus /DB via column select gate CSG or spare column select gate SCSG.

When write data DIN is at a data level of H level, the data write currents in the opposite directions can be passed through bit lines BL, /BL of the selected column or spare bit lines SBL, /SBL by reversing the voltage settings of data buses DB and /DB.

Thus, when column address CA and defective address FAD mismatch, a normal memory cell (selected memory cell) having data write currents passed through both corresponding write word line WWL and bit line BL (/BL) becomes a target to access, and data is written into the selected memory cell. By comparison, when column address CA and defective address FAD match, spare memory cell SMC belonging to the same memory cell row as the selected memory cell becomes a target to access. That is, by making the data write currents pass through both corresponding write word line WWL and spare bit line SBL (/SBL), data is written into spare memory cell SMC.

In the data write operation, read word lines RWL and dummy read word lines DRWL0, DRWL1 are maintained in a non-selected state (L level).

Next, the data read operation is described.

At the time of data read, word line driver 30 activates read word line RWL corresponding to a selected row to an H level in accordance with the result of row selection of row decoder 20. In a non-selected row, the voltage level of read word line RWL is maintained in an inactive state (L level). Further, one of dummy read word lines DRWL0, DRWL1 is activated to an H level at a timing similar to that of read word line RWL of the selected row, according to whether the selected row is an even row or an odd row, as described above.

At the start of data read, read word line RWL of the selected row is activated to an H level, and corresponding access transistors ATR turn on. Then, normal memory cells MC and spare memory cell SMC corresponding to the selected row are electrically connected between bit line BL, /BL and spare bit line SBL, /SBL and ground voltage Vss, respectively, via access transistors ATR.

Data read circuit 51R pulls up each of data buses DB and /DB with power supply voltage Vcc1, and supplies constant sense current Is.

Further, in accordance with column address CA, column select line CSL of the selected column or spare column select line SCSL is selectively activated (to an H level), as in the case of data write.

When column address CA and defective address FAD mismatch, in response to activation of column select line CSL of the selected column, the selected memory cell (normal memory cell) and one of the dummy memory cells DMC belonging to the same memory cell column as the selected memory cell are connected to one and the other of data buses DB and /DB via one and the other of bit lines BL and /BL of the selected column as the access targets. With sense current Is from data read circuit 51R, a voltage change corresponding to the electric resistance (Rmax, Rmin) of tunneling magneto-resistance element TMR, i.e., the level of stored data in the selected memory cell, occurs in one of bit lines BL and /BL of the selected column and in one of data buses DB and /DB. Similarly, in the other of bit lines BL and /BL of the selected column and in the other of data buses DB and /DB, a voltage change corresponding to the intermediate electric resistance of dummy memory cell DMC belonging to the same memory cell column as the selected memory cell occurs.

For example, in the case where the stored data of the selected memory cell is at a level corresponding to electric resistance Rmax, a voltage change ΔV1 occurs on one of bit lines BL and /BL coupled to the selected memory cell that is greater than a voltage change ΔVm occurring in the other of bit lines BL and /BL coupled to dummy memory cell DMC (ΔV1>ΔVm). Similarly, voltage changes ΔVb1 and ΔVbm occur in data buses DB and /DB (ΔVbm>ΔVb1). By using data read circuit 51R to sense and amplify the voltage difference thus generated between data buses DB and /DB, the stored data in the selected memory cell can be output as read data DOUT.

On the other hand, when column address CA and defective address FAD match, spare column select line SCSL is activated instead of column select line CSL of the selected column. As a result, instead of the selected memory cell (normal memory cell), spare memory cell SMC belonging to the same memory cell row as the selected memory cell becomes an access target, and is connected to one of data buses DB and /DB via one of spare bit lines SBL and /SBL.

Similarly, instead of dummy memory cell DMC of the selected column, spare dummy memory cell SDMC belonging to the same dummy memory cell row as the dummy memory cell becomes an access target. The spare dummy memory cell SDMC is connected to the other of spare bit lines SBL and /SBL in response to activation of dummy read word line DRWL0 or DRWL1 shared with the relevant dummy memory cell, and receives sense current Is.

As such, spare memory cells SMC and spare dummy memory cells SDMC share the memory cell rows and the dummy memory cell rows with normal memory cells MC and dummy memory cells DMC, respectively. Thus, row selection of spare memory cells SMC and spare dummy memory cells SDMC can be done using the common read word lines RWL, write word lines WWL and dummy read word lines DRWL0, DRWL1. That is, in redundant column 11C, a configuration exclusively for selection of spare memory cell SMC and spare dummy memory cell SDMC is unnecessary.

By similarly supplying sense current Is from data read circuit 51R, a voltage change occurs in one of spare bit lines SBL and /SBL and in one of data buses DB and /DB in accordance with the stored data (electric resistance Rmax, Rmin) of the spare memory cell corresponding to the selected memory cell. In addition, a voltage change (ΔVm, ΔVbm) similar to the case where dummy memory cell DMC is the access target occurs in the other of spare bit lines SBL and /SBL and in the other of data buses DB and /DB.

As such, even if a defective column is selected by column address CA, data write and data read can be performed without fault on spare memory cell SMC and spare dummy memory cell SDMC in redundant column 11C as the access targets. In other words, defective memory cell(s) can be replaced/repaired using redundant column 11C in a unit of memory cell column.

In FIG. 4, the precharge voltages of bit lines BL, /BL and spare bit lines SBL, /SBL are set to ground voltage Vss. This prevents a discharge current from flowing in a non-selected column from bit lines BL, /BL and spare bit lines SBL, /SBL via access transistors turned on in response to activation of read word line RWL of a selected row. As a result, power consumption due to charge/discharge of the bit lines and spare bit lines at the time of precharging operation can be reduced.

In addition, the voltage Vcc2 as the operating power supply voltage of data write circuit 51W is set higher than the voltage Vcc1 as the operating power supply voltage of data read circuit 51R. This is because the data write currents Ip, ±Iw necessary to magnetize tunneling magneto-resistance element TMR of a selected memory cell at the time of data write is greater than the sense current Is necessary for data read. For example, if an external power supply voltage supplied from the outside of MRAM device 1 is employed without alteration as power supply voltage Vcc2, and this external power supply voltage is processed by a voltage down converter (not shown) to generate power supply voltage Vcc1, then power supply voltages Vcc1 and Vcc2 can be supplied efficiently.

As described above, according to the configuration of the first embodiment, the direction in which dummy memory cells DMC are arranged (row direction) and the direction in which spare memory cells SMC are arranged (column direction) are different from each other. Thus, using redundant column 11C including both spare memory cells SMC and spare dummy memory cells SDMC, defects of not only normal memory cells MC but also dummy memory cells DMC can be replaced/repaired in a unit of memory cell column.

In other words, if it is configured to perform replacement/ repair in a unit of memory cell row in the memory array arrangement having dummy memory cell rows formed therein, separate redundant rows would be necessary for the spare memory cells SMC and spare dummy memory cells SDMC, respectively, and separate signal interconnections should be provided to select the respective redundant rows. In particular, if the folded bit line configuration as shown in FIG. 2 is adapted, two redundant rows would become necessary for replacement of the dummy memory cell row. According to the present embodiment, however, provision of redundant column 11C permits replacement/repair of both normal memory cells MC and dummy memory cells DMC, so that the layout area of spare memory cells SMC and spare dummy memory cells SDMC is reduced, and thus, downsizing of the memory array becomes possible.

First Modification of First Embodiment

Figure 5:
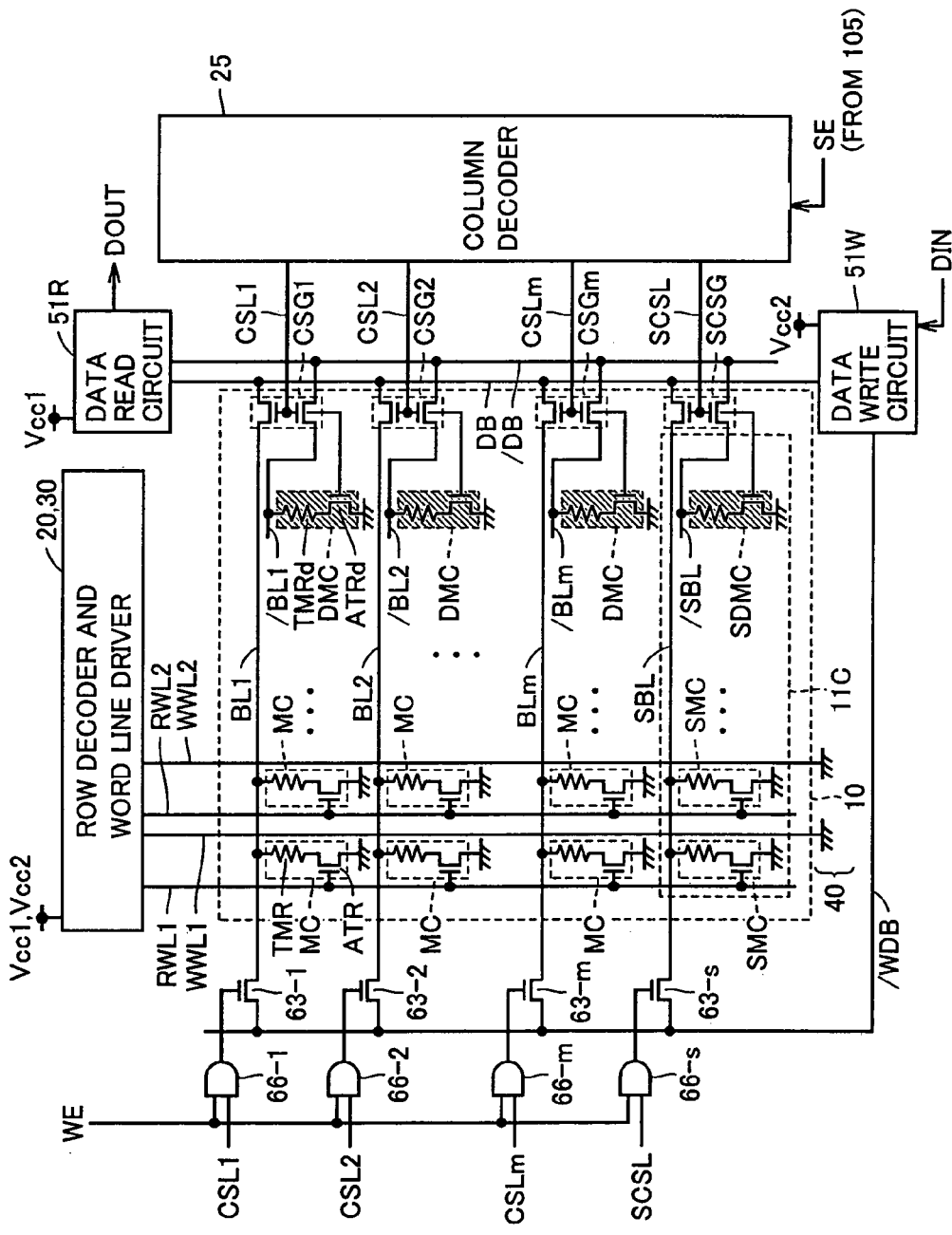
FIGS. 5–7 are circuit diagrams showing configurations of the memory arrays according to the first through third modifications of the first embodiment.

Referring to FIG. 5, the configuration of the memory array according to the first modification of the first embodiment differs from that of the first embodiment shown in FIG. 2 in that dummy memory cells DMC are arranged one for each memory cell column. In the respective memory cell columns, normal memory cells MC are connected to corresponding bit lines BL1, BL2, . . . BLm, and dummy memory cells DMC are fixedly connected to the other bit lines /BL1, /BL2, . . . /BLm.

Further, dummy read word lines DRWL0 and DRWL1 are unprovided, and dummy memory cells DMC are also selected by column select lines CSL1–CSLm. That is, each dummy memory cell DMC has dummy access transistor ATRd whose gate is connected to corresponding column select line CSL.

In redundant column 11C, spare memory cells SMC for replacement of normal memory cells MC are connected to spare bit line SBL, and spare dummy memory cell SDMC for replacement of dummy memory cell DMC is connected to spare bit line /SBL. Spare dummy memory cell SDMC is selected by spare column select line SCSL.

In the configuration according to the first modification of the first embodiment, an inverse write data bus /WDB is additionally provided for execution of data write, and transistor switches 63-1 to 63-m and 63-s replace transistor switches 62-1 to 62-m and 62-s. Bit lines BL1–BLm are connected to inverse write data bus /WDB via transistor switches 63-1 to 63-m, respectively. Spare bit line SBL is connected to inverse write data bus /WDB via transistor switch 63-s.

Transistor switches 63-1 to 63-m and 63-s are turned on/off under the control of control gates 66-1 to 66-m and 66-s, as in the case of transistor switches 62-1 to 62-m and 62-s. Hereinafter, transistor switches 63-1 to 63-m are also simply referred to as transistor switch 63 collectively. Otherwise, the configurations and operations of the first modification of the first embodiment are the same as those of the first embodiment, and thus, detailed description thereof is not repeated.

In the data write operation, either column select line CSL of a selected column or spare column select line SCSL is selectively activated according to whether the selected column includes a defective memory cell.

In response thereto, if the selected column does not include a defective memory cell, column select gate CSG and transistor switch 63 corresponding to the selected column turn on. As a result, bit line BL of the selected column is electrically coupled between data bus DB and inverse write data bus /WDB. On the contrary, if the selected column includes a defective memory cell, spare column select line SCSL is activated in response to activated spare enable signal SE, and transistor switch 63-s and spare column select gate SCSG turn on. Thus, spare bit line SBL is connected between data bus DB and inverse write data bus /WDB.

In this state, data write circuit 51W sets data bus DB and inverse write data bus /WDB to one and the other of power supply voltage Vcc2 (H level) and ground voltage Vss (L level) in accordance with write data DIN, as explained in conjunction with FIG. 4.

In the data read operation, each of transistor switches 63-1 to 63-m and 63-s is turned off. Further, either column select line CSL of the selected column or spare column select line SCSL is selectively activated according to whether the selected column includes a defective memory cell.

As a result, if the selected column does not include a defective memory cell, the selected memory cell and the corresponding dummy memory cell are connected to data buses DB and /DB via bit lines BL and /BL of the selected column, respectively. On the contrary, if the selected column includes a defective memory cell, spare memory cell SMC in the same memory cell row as the selected memory cell and corresponding spare dummy memory cell SDMC are connected to data buses DB and /DB via spare bit lines SBL and /SBL, respectively.

In this state, data read circuit 51R, as described in conjunction with FIG. 4, supplies sense current Is to data buses DB and /DB, and generates read data DOUT in accordance with the voltage difference between data buses DB and /DB.

Thus, in the configuration according to the first modification of the first embodiment, again, replacement/repair of both normal memory cells MC and dummy memory cells DMC can be carried out using redundant column 11C having the same configuration as the memory cell columns corresponding to normal memory cells MC.

In particular, in the configuration according to the first modification of the first embodiment, dummy memory cell DMC and spare dummy memory cell SDMC are selected based on the result of column selection. Thus, an unnecessary current is prevented from passing through dummy memory cells DMC and spare dummy memory cells SDMC in a non-selected memory cell column and in redundant column 11C when not in use, so that reduction of power consumption and speeding of operations become possible. In addition, for dummy memory cell DMC (or spare dummy memory cell SDMC) relatively frequently accessed compared to each of normal memory cells MC (or spare memory cells SMC) arranged in the same memory cell column, an unnecessary access can be avoided, so that operational reliability improves.

Second Modification of First Embodiment

Figure 6:
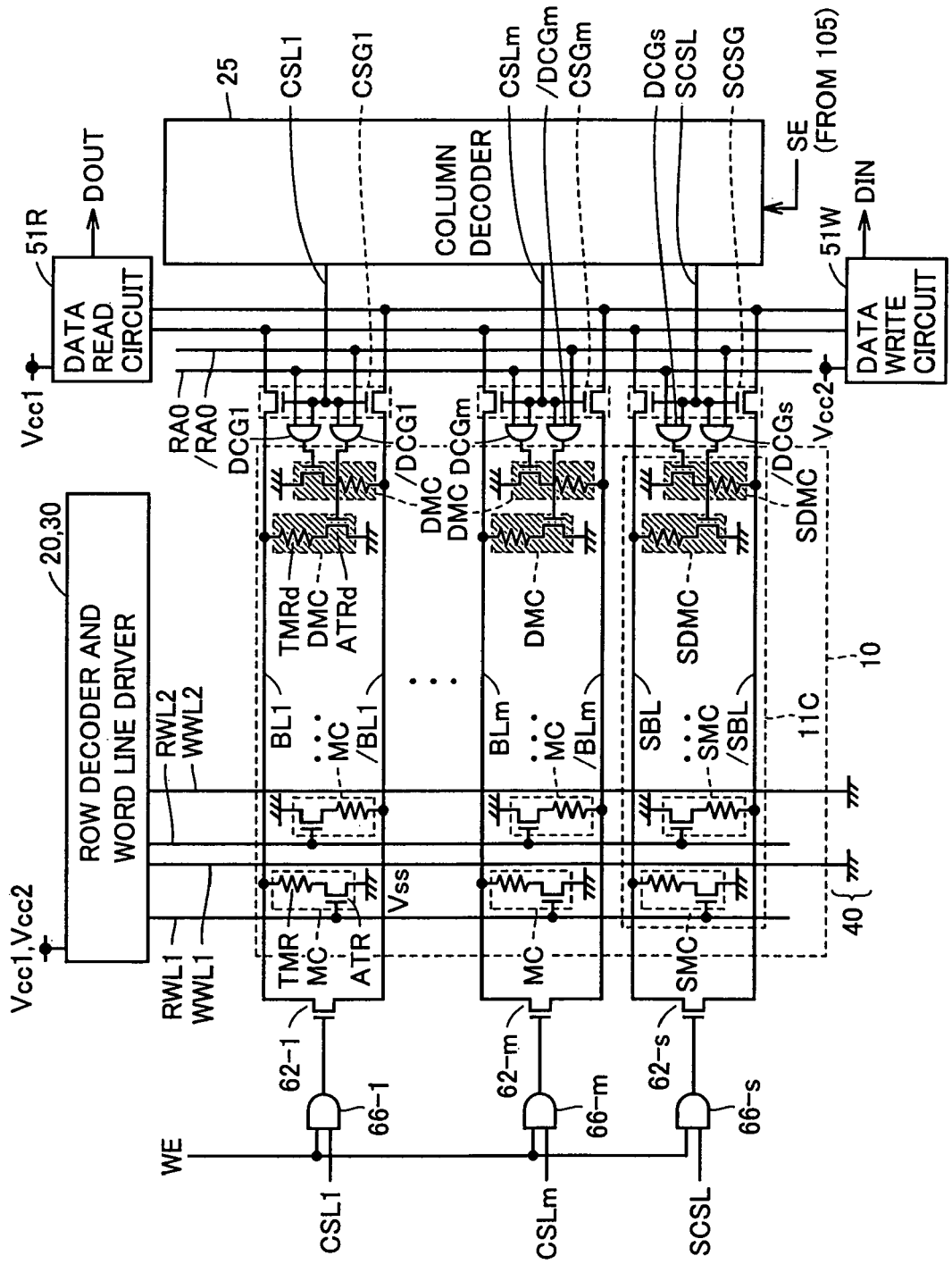

Referring to FIG. 6, the configuration of the memory array according to the second modification of the first embodiment differs from that of the first embodiment shown in FIG. 2 in that dummy cell select gates DCG1, /DCG1 to DCGm, /DCGm and spare dummy cell select gates DCGs, /DCGs are provided in place of dummy read word lines DRWL0 and DRWL1.

Dummy cell select gates DCG1–DCGm are provided corresponding to dummy memory cells DMC connected to bit lines /BL1–/BLm, respectively. Spare dummy cell select gate DCGs is provided corresponding to spare dummy memory cell SDMC connected to spare bit line /SBL. Similarly, dummy cell select gates /DCG1–/DCGm are provided corresponding to dummy memory cells DMC connected to bit lines BL1–BLm, respectively, and spare dummy cell select gate /DCGs is provided corresponding to spare dummy memory cell SDMC connected to spare bit line SBL.

Hereinafter, dummy cell select gates DCG1–DCGm are also simply referred to as dummy cell select gate DCG, and dummy cell select gates /DCG1–/DCGm are also simply referred to as dummy cell select gate /DCG collectively.

Each dummy cell select gate DCG outputs an AND operation result of voltage levels of a control signal RA0 that is set to an H level when an odd row is selected and corresponding column select line CSL to a gate of dummy access transistor ATRd in the corresponding dummy memory cell DMC. On the other hand, dummy cell select gate /DCG outputs an AND operation result of voltage levels of a control signal /RA0 (inverse signal of RA0) that is set to an H level when an even row is selected and corresponding column select line CSL to a gate of dummy access transistor ATRd in the corresponding dummy memory cell DMC. Otherwise, the configurations and operations of the second modification of the first embodiment are the same as those of the first embodiment, so that detailed description thereof is not repeated.

With such a configuration, in the data read operation, dummy memory cell DMC and spare dummy memory cell SDMC can be selected based on the result of column selection, and then, a selected memory cell MC (or corresponding spare memory cell SMC) and dummy memory cell DMC (or spare dummy memory cell SDMC) can be accessed according to the redundancy control.

Accordingly, as in the configuration according to the first modification of the first embodiment, an unnecessary current flow to dummy memory cell DMC and spare dummy memory cell SDMC is prevented in a non-selected memory cell column and in redundant column 11C when not in use.

Thus, reduction of power consumption, speeding of operations, and improvement of operational reliabilities of dummy memory cell DMC and spare dummy memory cell SDMC become possible.

Third Modification of First Embodiment

Figure 7:
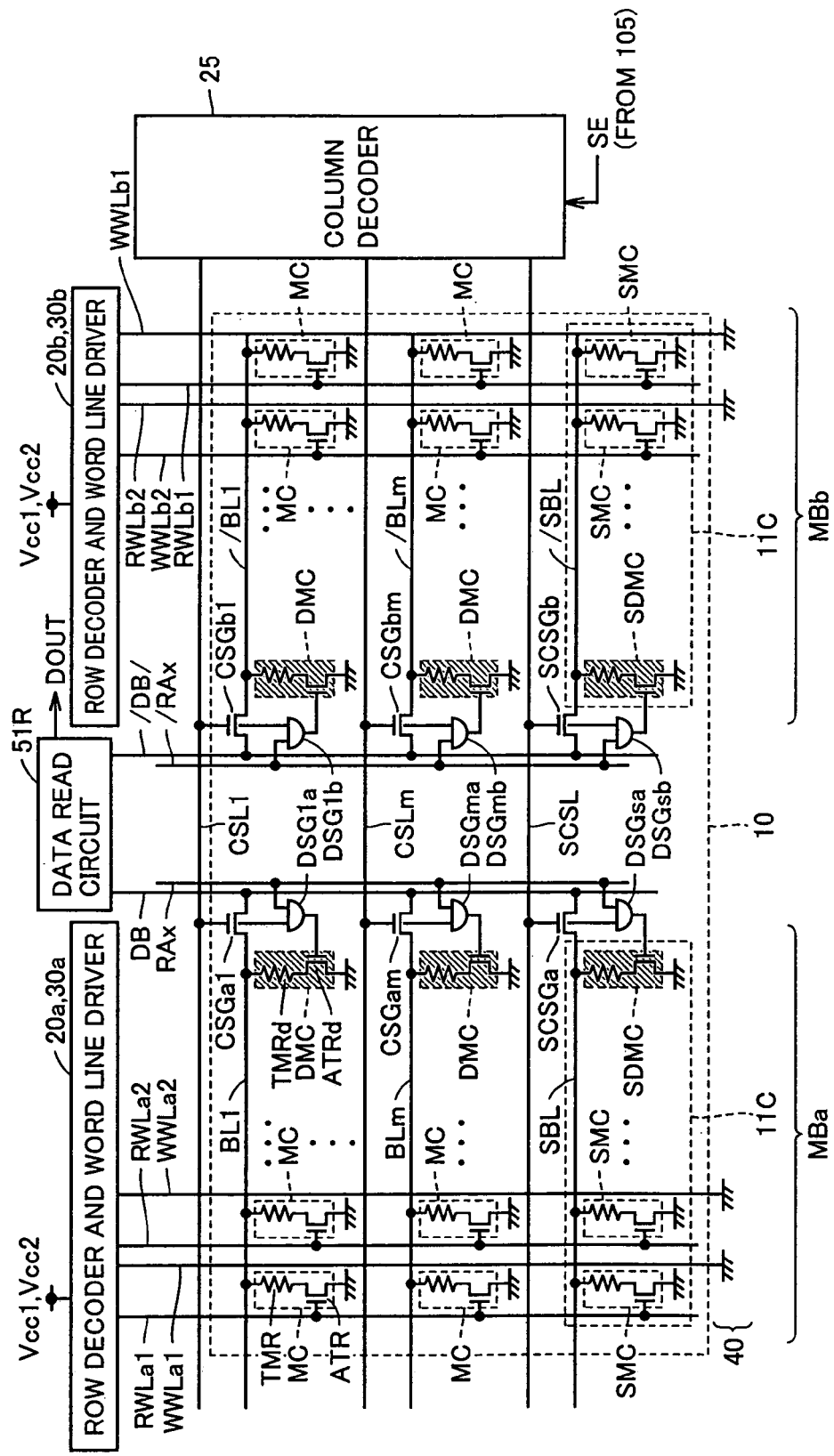

Referring to FIG. 7, in the configuration of the memory array according to the third modification of the first embodiment, memory array 10 is divided to two memory blocks MBa and MBb, each having m normal memory cell columns and a redundant column 11C.

In memory block MBa, bit lines BL1–BLm are arranged corresponding to the m normal memory cell columns, and spare bit line SBL is arranged corresponding to redundant column 11C. Dummy memory cells DMC are arranged one for each memory cell column, and connected to respective bit lines BL1–BLm.

Redundant column 11C has spare memory cells SMC for replacement/repair of normal memory cells MC and spare dummy memory cell SDMC for replacement/repair of dummy memory cell DMC arranged in the column direction. Spare memory cells SMC are arranged to share the memory cell rows with normal memory cells MC. Spare dummy memory cell SDMC is arranged to form a dummy memory cell row with dummy memory cells DMC. Spare memory cells SMC and spare dummy memory cell SDMC in redundant column 11C are connected to spare bit line SBL.

Bit lines BL1–BLm and spare bit line SBL are connected to data bus DB via column select gates CSGa1–CSGam and spare column select gate SCSGa, respectively.

Read word lines RWLa1, RWLa2, . . . and write word lines WWLa1, WWLa2, . . . are arranged corresponding to the respective memory cell rows shared by normal memory cells MC and spare memory cells SMC. As the configuration for selecting dummy memory cells DMC and spare dummy memory cell SDMC, dummy select gates DSG1a–DSGma corresponding to the respective memory cell columns and a spare dummy select gate DSGsa corresponding to redundant column 11C are provided.

Memory block MBb has the same configuration as memory block MBa. That is, in memory block MBb, bit lines /BL1–/BLm are arranged corresponding to m normal memory cell columns, and spare bit line /SBL is arranged corresponding to a redundant column 11C. Dummy memory cells DMC are arranged one for each memory cell column, and connected to respective bit lines /BL1–/BLm. In redundant column 11C, spare memory cells SMC and spare dummy memory cell SDMC are connected to spare bit line /SBL. Bit lines /BL1–/BLm and spare bit line /SBL are connected to data bus /DB via column select gates CSGb1–CSGbm and spare column select gate SCSGb, respectively.

Further, memory block MBb is provided with read word lines RWLb1, RWLb2, . . . and write word lines WWLb1, WWLb2, . . . arranged corresponding to the memory cell rows shared by normal memory cells MC and spare memory cells SMC. Dummy select gates DSG1b–DSGmb and a spare dummy select gate DSGsb are also provided corresponding to the memory cell columns and redundant column 11C, respectively, for selection of dummy memory cells DMC and spare dummy memory cell SDMC.

Column select lines CSL1–CSLm and spare column select line SCSL are arranged in the column direction such that they are shared by memory blocks MBa and MBb. Column select gates CSGa1–CSGam and CSGb1–CSGbm are turned on/off in response to corresponding column select lines CSL1–CSLm, and spare column select gates SCSGa, SCSGb are turned on/off in response to spare column select line SCSL.

Dummy select gates DSG1a–DSGma in memory block MBa each output an AND operation result of voltage levels of an address bit RAx that is activated to an H level when memory block MBb is selected and corresponding column select line CSL1–CSLm, to a gate of dummy access transistor ATRd in corresponding dummy memory cell DMC. Likewise, spare dummy select gate DSGsa in memory block MBa outputs an AND operation result of voltage levels of address bit RAx and spare column select line SCSL to a gate of dummy access transistor ATRd in corresponding spare dummy memory cell SDMC.

Similarly, dummy select gates DSG1b–DSGmb in memory block MBb each output an AND operation result of voltage levels of an address bit /RAx (inverse signal of RAx) that is activated to an H level when memory block MBa is selected and corresponding column select line CSL1–CSLm, to a gate of dummy access transistor ATRd in corresponding dummy memory cell DMC. Likewise, spare dummy select gate DSGsb in memory block MBb outputs an AND operation result of voltage levels of address bit /RAx and spare column select line SCSL to a gate of dummy access transistor ATRd in corresponding spare dummy memory cell SDMC.

Although only the circuits related to data read have been shown in FIG. 7 to primarily illustrate arrangement of dummy memory cells DMC and spare dummy memory cells SDMC, each memory block is also provided with the circuits for data write configured as shown in FIG. 5.

Next, the data read operation is described, taking the case where a selected memory cell is included in memory block MBa as an example.

In the data read operation, if a selected memory cell column does not include a defective memory cell, column select line CSL of the selected column is activated. In response thereto, in memory block MBa, the selected memory cell is connected to data bus DB via bit line BL of the selected column. In memory block MBb, dummy memory cell DMC is connected to data bus /DB via bit line /BL of the selected memory cell column.

On the contrary, if the selected memory cell column includes a defective memory cell, spare column select line SCSL is activated instead of column select line CSL corresponding to the relevant selected column. Thus, in memory block MBa, spare memory cell SMC is connected to data bus DB via spare bit line SBL, and in memory block MBb, spare dummy memory cell SDMC is connected to data bus /DB via spare bit line /SBL.

In this state, a sense current is supplied from data read circuit 51R to data buses DB and /DB, and a voltage difference between data buses DB and /DB is sensed. Thus, data can be read from the selected memory cell.

If the selected memory cell is included in memory block MBb, connections with respect to data buses DB and /DB are reversed. Thus, in the memory array configuration where the memory array is divided into memory blocks, again, it is possible to replace/repair both normal memory cells MC and dummy memory cells DMC using redundant columns 11C arranged in the respective memory blocks, so that the same effects as in the first and second modifications of the first embodiment can be enjoyed.

Second Embodiment

In the second embodiment of the present invention, an efficient way of replacing dummy memory cells in the case where each dummy memory cell is designed to have the same configuration and characteristics as a normal memory cell is described.

Figure 8:
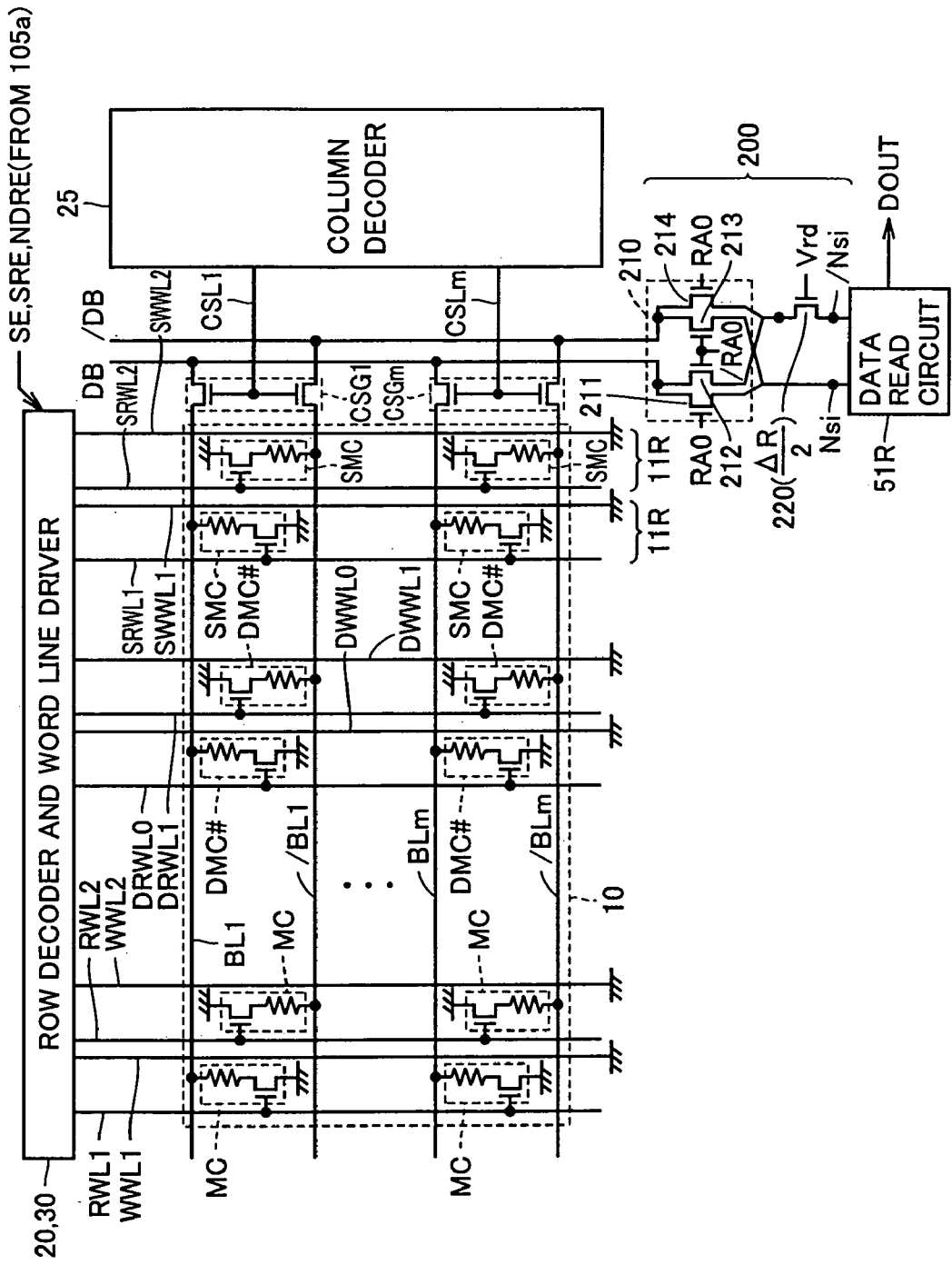
FIG. 8 is a circuit diagram showing a memory array configuration and a configuration for reading data from the memory array according to a second embodiment of the present invention.

FIG. 8 is a circuit diagram showing a memory array configuration and a configuration for reading data from the relevant memory array according to the second embodiment.

Referring to FIG. 8, in the configuration according to the second embodiment, normal memory cells MC and dummy memory cells DMC# in alternate rows are connected to complementary bit lines BL and /BL based on the folded bit line configuration, as in the memory array configuration shown in FIG. 2. Specifically, in the configuration shown in FIG. 8, compared to the arrangement of normal memory cells MC and dummy memory cells DMC shown in FIG. 2, dummy memory cells DMC# replacing dummy memory cells DMC are arranged to form dummy memory cell rows. Dummy memory cells DMC# each having the same configuration and shape as normal memory cell MC can be formed using some of the MTJ memory cells continuously fabricated in the same memory array. That is, special design and manufacturing steps are unnecessary for fabrication of the dummy memory cells, so that an increase of chip area due to a complicated structure, degradation of process margin of memory array and other problems are avoided. Each dummy memory cell DMC# is magnetized in advance in a direction to have a prescribed electric resistance of, e.g., Rmin.

In the configuration according to the second embodiment, a resistance adjusting portion 200 is further provided between data buses DB and /DB and data read circuit 51R such that data read is performed with reference to the dummy memory cells having the same characteristics as normal memory cell MC.

Resistance adjusting portion 200 includes a connection switching circuit 210 and a dummy resistance 220. Dummy resistance 220 is connected in series with a sense input node /Nsi. The electric resistance of dummy resistance 220 corresponds to a difference (preferably ΔR/2) between Rmin and the electric resistance of dummy memory cell DMC in the first embodiment and in its modifications. Minute control of the electric resistance of dummy resistance 220 becomes possible, e.g., by configuring dummy resistance 220 with a MOS transistor having its gate receiving a variable control voltage Vrd.

Connection switching circuit 210 has transistor switches 211 and 212 which are electrically coupled between sense input nodes Nsi and /Nsi and data bus DB, respectively, and transistor switches 213 and 214 which are electrically coupled between sense input nodes Nsi and /Nsi and data bus /DB, respectively. The respective gates of transistor switches 211 and 214 receive control signal RA0 that is set to an H level when an odd row is selected. The respective gates of transistor switches 212 and 213 receive control signal /RA0 that is set to an H level when an even row is selected. As a result, whether an odd row or an even row is selected, the selected memory cell is connected in series with sense input node Nsi, and dummy memory cell DMC is connected in series with sense input node /Nsi.

Thus, in the data read operation, combined electric resistance of dummy memory cell DMC and resistance adjusting portion 200 is set to "Rmin+ΔR/2 (dummy resistance 220)", regardless of the result of row selection. On the other hand, combined electric resistance of the selected memory cell and resistance adjusting portion 200 becomes either Rmax or Rmin depending on the stored data in the selected memory cell. Thus, by using data read circuit 51R to supply a sense current to sense input nodes Nsi and /Nsi and sense a voltage difference therebetween, data can be read in accordance with a difference in electric resistance between the selected memory cell and the dummy memory cell.

Next, redundancy repair performed in the configuration according to the second embodiment is described.

In the configuration of the second embodiment, instead of redundant column 11C in FIG. 2, redundant rows 11R are further arranged which are commonly used for replacement/repair of the normal memory cell rows and the dummy memory cell rows. It is necessary to provide at least one redundant row 11R (for replacement of odd row) formed of spare memory cells SMC connected to bit lines BL1–BLm and at least one redundant row 11R (for replacement of even row) formed of spare memory cells SMC connected to bit lines /BL1–/BLm.

Spare memory cells SMC, each having the same configuration and shape as normal memory cell MC, may be configured using some of the MTJ memory cells continuously fabricated in the same memory array. Spare read word line SRWL and spare write word line SWWL are arranged corresponding to respective redundant row 11R. In FIG. 8, redundant rows 11R one for replacement of odd row and one for replacement of even row, corresponding spare read word lines SRWL0, SRWL1, and spare writhe word lines SWWL0, SWWL1 are shown representatively. Otherwise, the configuration of the second embodiment is the same as that of the first embodiment, and thus, detailed description thereof is not repeated. It is noted that, although only the circuits associated with data read are again illustrated in FIG. 8 to mainly describe dummy memory cells DMC# and the replacement/repair method thereof, the circuits associated with data write as in FIG. 2 are also provided.

In the configuration according to the second embodiment, it is necessary to replace both normal memory cells MC and dummy memory cells DMC# using redundant rows 11R. Thus, a redundancy control method different from that of the first embodiment is required.

Figure 9:
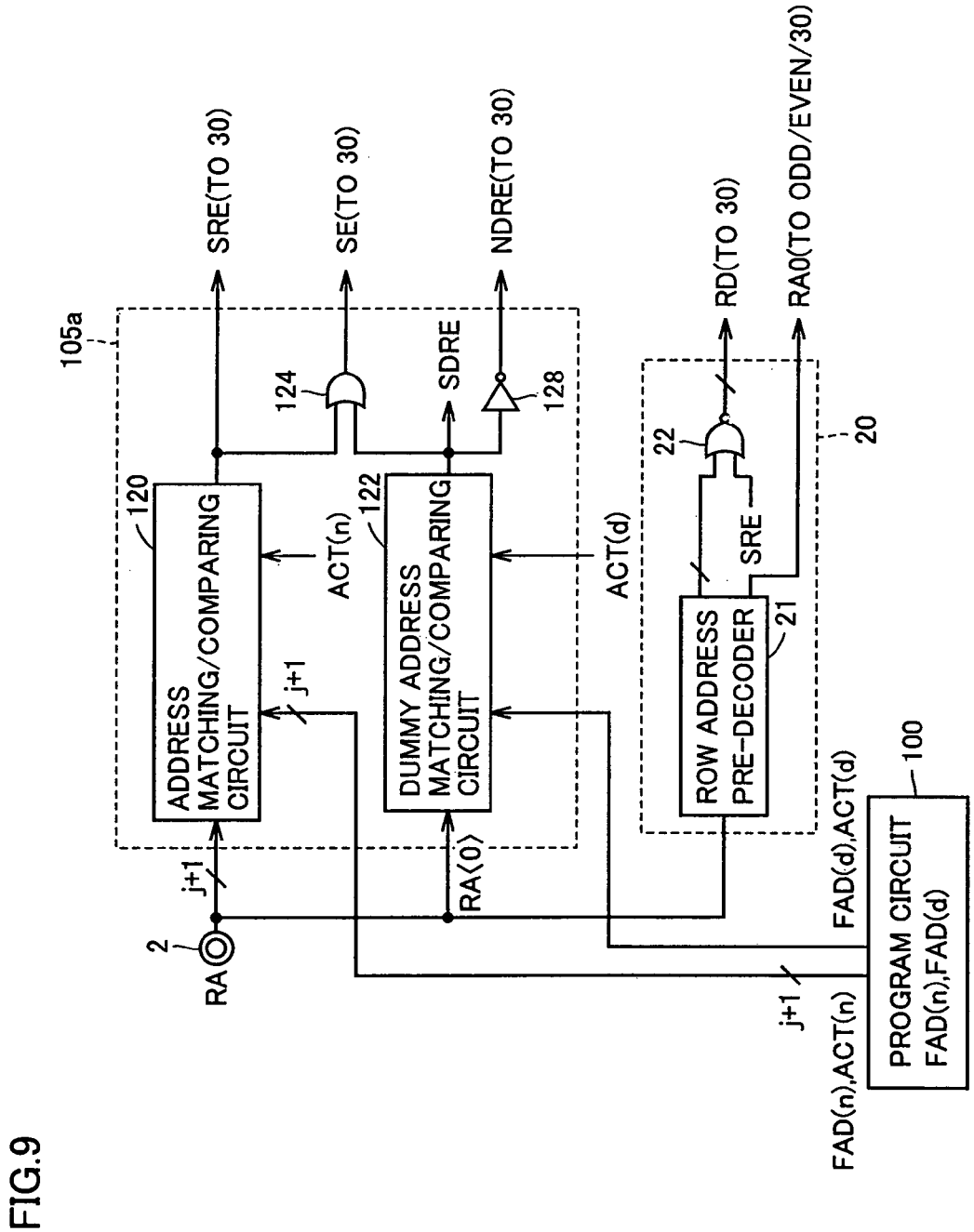
FIG. 9 is a circuit diagram showing a configuration of the redundancy control circuit according to the second embodiment.

FIG. 9 is a circuit diagram showing the redundancy control circuit according to the second embodiment.

Referring to FIG. 9, in the configuration according to the second embodiment, the program circuit 100 is capable of storing both a defective address FAD (n) indicating the row of normal memory cells MC including a defect and a defective address FDA (d) indicating the row of dummy memory cells DMC including a defect. However, since it is impossible to replace both normal memory cell MC and dummy memory cell DMC# using one redundant row 11R, it is assumed that program circuit 100 stores only one of defective addresses FAD (n) and FAD (d). In the case where defective address FAD (n) is stored, i.e., when it is necessary to replace/repair the defect in normal memory cells MC, redundant row activating signal ACT (n) is activated to an H level.

On the other hand, when defective address FAD (d) is stored, i.e., when the defect in dummy memory cells DMC should be replaced/repaired, redundant row activating signal ACT (d) is activated to an H level. In this case, it is necessary to write, in advance, stored data corresponding to a prescribed electric resistance (Rmin) of dummy memory cell DMC# to each spare memory cell SMC.

Here, defective address FAD (n) is configured with (j+1) bits (j is a natural number) indicating the normal memory cell row which includes a defect, while defective address FAD (d) is configured with one bit indicating which one of two dummy memory cell rows includes a defect.

Redundancy control circuit 105a according to the second embodiment includes an address matching/comparing circuit 120, a dummy address matching/comparing circuit 122, a logic gate 124, and an inverter 128. Address matching/comparing circuit 120 has the same configuration as redundancy control circuit 105 shown in FIG. 3, and performs matching/comparison for the (j+1) bits between row address RA and defective address FAD (n). Address matching/comparing circuit 120 activates a spare row enable signal SRE to an H level when redundant row activating signal ACT (n) is activated (to an H level) and row address RA and defective address FAD (n) match with each other.

Dummy address matching/comparing circuit 122 performs matching/comparison between an address bit RA<0> (e.g., the least significant bit) in row address RA indicating which row, even row or odd row, was selected and defective address FAD (d). Dummy address matching/comparing circuit 122 activates a spare dummy row enable signal SDRE to an H level when redundant row activating signal ACT (d) is activated (to an H level) and address bit RA<0> and defective address FAD (d) match with each other.

Logic gate 124 performs an OR operation of spare row enable signal SRE and spare dummy row enable signal SDRE, and outputs the result as a spare enable signal SE. Inverter 128 inverts spare dummy row enable signal SDRE, and outputs it as a normal dummy row enable signal NDRE.

Row decoder 20 includes a row address pre-decoder 21 and a logic gate 22. Row address pre-decoder 21 receives row address RA and outputs its pre-decoded results (of a plurality of bits). Logic gate 22 performs NOR operations between the respective pre-decoded results output from row address pre-decoder 21 and spare row enable signal SRE, and outputs the results as a row decode signal RD. Row decode signal RD is transmitted to word line driver 30 and used for selection of read word line RWL or write word line WWL. Control signal RA0 indicating the result of selection of even row or odd row is also transmitted to word line driver 30 for selection of dummy read word line DRWL0 or DRWL1.

Row decode signal RD has its bits all set to an L level when spare row enable signal SRE is activated to an H level, i.e., row address RA and defective address FAD (n) match with each other. In response, word line driver 30 inactivates every read word line RWL and write word line WWL corresponding to the normal memory cells.

On the other hand, when row address RA and defective address FAD (n) mismatch, row decode signal RD is set in accordance with the pre-decoded results of row address pre-decoder 21, and word line driver 30 activates read word line RWL (at the time of data read) or write word line WWL (at the time of data write) corresponding to the selected row.

Word line driver 30 further controls activation of spare read word lines SRWL1, SRWL2 and spare write word lines SWWL1, SWWL2 based on control signal RA0 and spare row enable signal SRE from redundancy control circuit 105a. Specifically, in the case where a defect in the normal memory cell row is to be replaced, i.e., when spare row enable signal SRE is activated, it selectively activates one of spare read word lines SRWL1 and SRWL2 at the time of data read, and selectively activates one of spare write word lines SWWL1 and SWWL2 at the time of data write, based on control signal RA0.

On the other hand, in the case where a defect in the dummy memory cell row is to be replaced, i.e., when spare dummy row enable signal SDRE is activated, read word line RWL of the selected row is activated at the time of data read based on row decode signal RD, and one of spare read word lines SRWL1 and SRWL2, instead of dummy read word lines DRWL0 and DRWL1, is selectively activated in response to control signal RA0. At the time of data write, since it is unnecessary to access dummy memory cell DMC, write word line WWL of the selected row is activated based on row decode signal RD, with spare write word lines SWWL1 and SWWL2 each remained inactivated (at an L level).

Employing the redundancy determination method as described above, in the memory array configuration where dummy memory cells each having the same configuration as the normal memory cell are arranged to form dummy memory rows, it is possible to replace/repair defects in both normal memory cells MC and in dummy memory cells DMC# by commonly employing spare memory cells SMC which are efficiently arranged to form redundant rows.

First Modification of Second Embodiment

Figure 10:
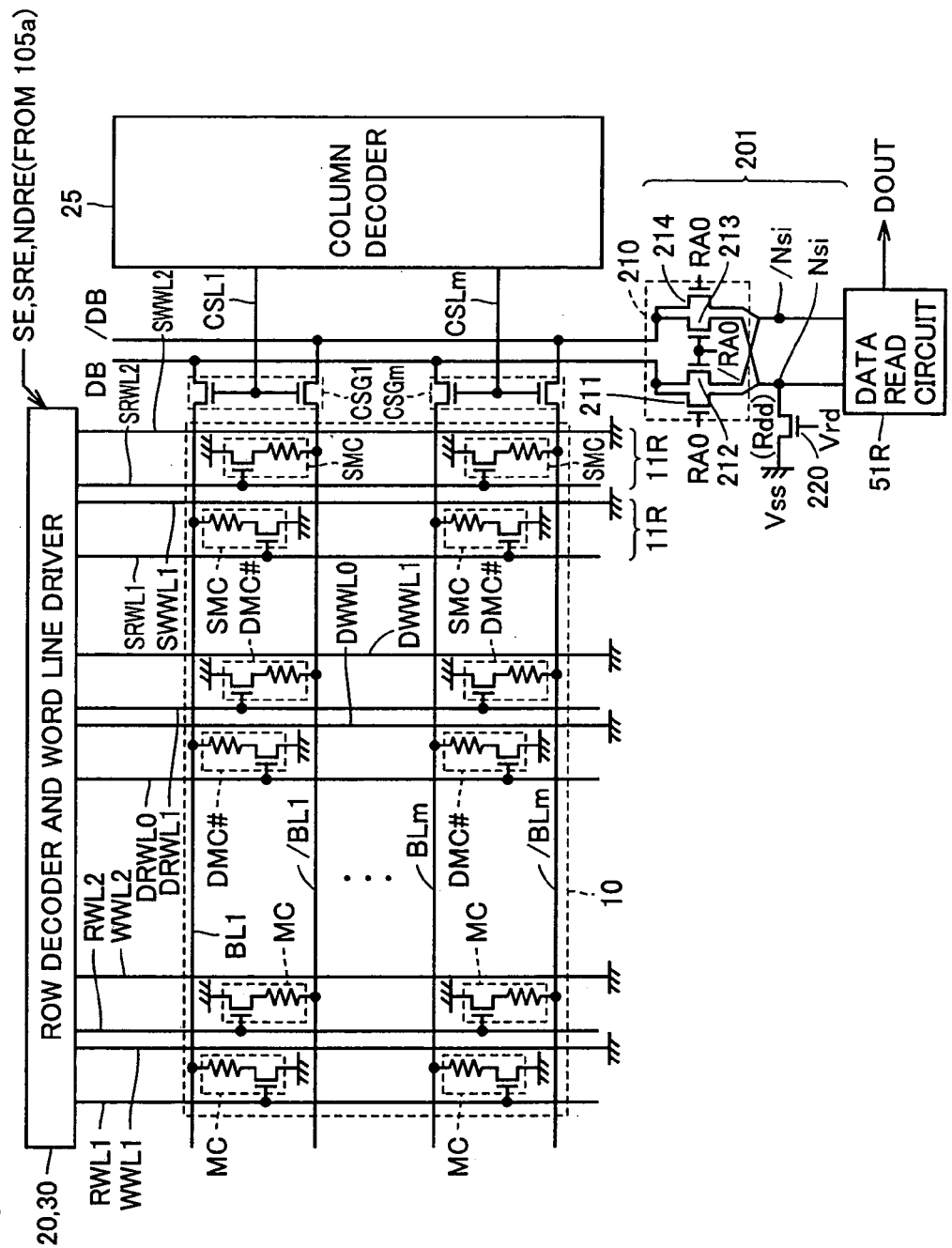
FIGS. 10 and 11 are circuit diagrams showing memory array configurations and configurations for reading data from the memory arrays according to first and second modifications, respectively, of the second embodiment.

Referring to FIG. 10, the configuration according to the first modification of the second embodiment is identical to the configuration according to the second embodiment shown in FIG. 8 except that resistance adjusting portion 200 is replaced with a resistance adjusting portion 201. Resistance adjusting portion 201 differs from resistance adjusting portion 200 in that dummy resistance 220 is connected in parallel with only sense input node Nsi. Dummy resistance 220 has an electric resistance Rdd according to control voltage Vrd. Otherwise, the configuration and operation of the first modification of the second embodiment are the same as those of the second embodiment, and thus, detailed description thereof is not repeated.

As already described, sense input node Nsi is electrically coupled by connection switching circuit 210 to the selected memory cell (having electric resistance Rmax or Rmin), regardless of the result of address selection (selection of odd row or even row). Sense input node /Nsi is connected in series with the dummy memory cell (having electric resistance Rmin). Thus, the electric resistance of dummy resistance 220 is set such that the combined resistance of dummy memory cell DMC# and resistance adjusting portion 201 (i.e., electric resistance Rmin of dummy memory cell DMC#) attains an intermediate level between the combined resistances obtained by parallel connection of the two kinds of electric resistances Rmax and Rmin and dummy resistance 220 (Rdd), i.e., (Rmin//Rdd) and (Rmax//Rdd). Accordingly, the same effects as in the second embodiment can be enjoyed with the configuration as described above.

Second Modification of Second Embodiment

Figure 11:
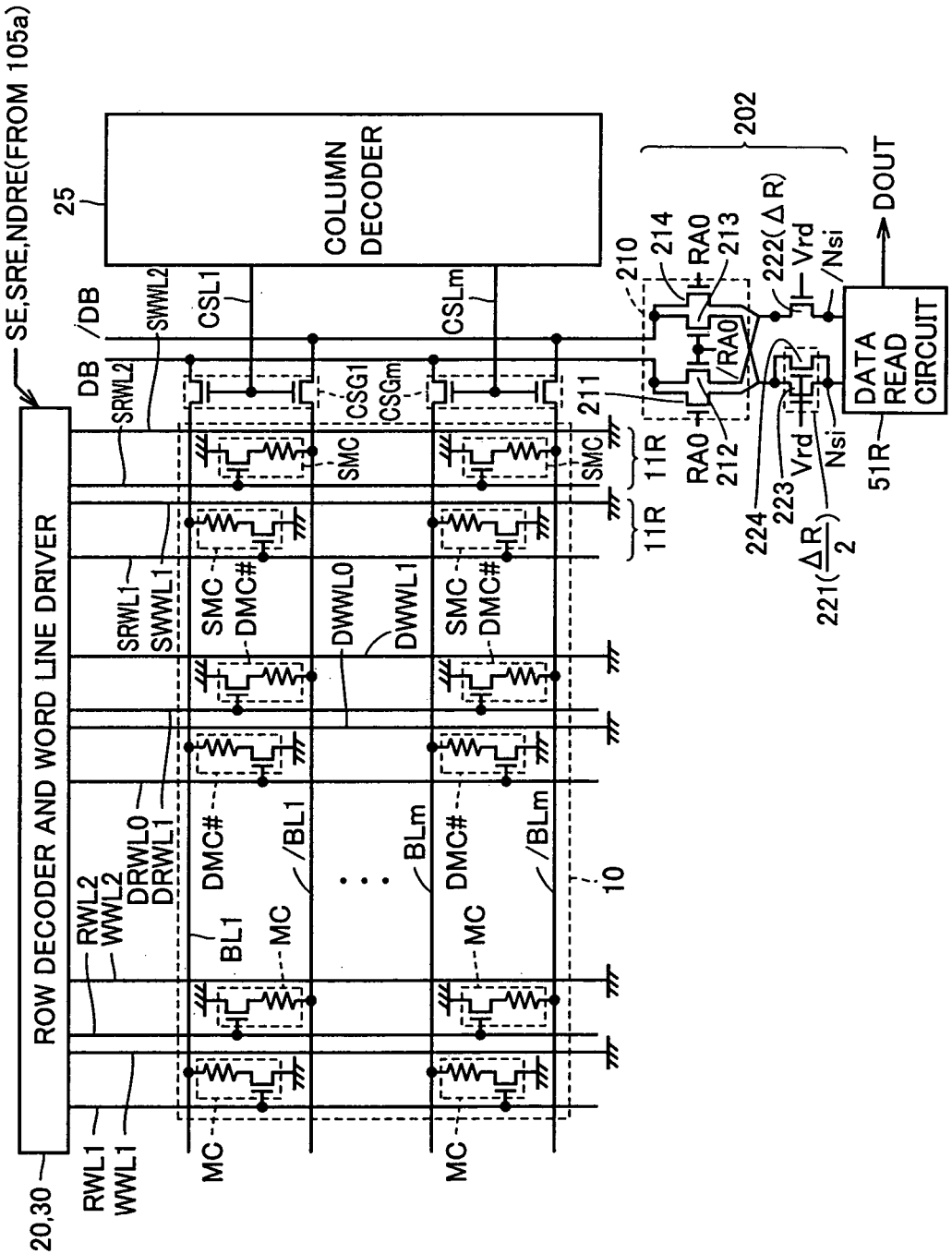

Referring to FIG. 11, the configuration according to the second modification of the second embodiment is identical to the configuration of the second embodiment shown in FIG. 8 except that resistance adjusting portion 200 is replaced with a resistance adjusting portion 202. Resistance adjusting portion 202 differs from resistance adjusting portion 200 in that dummy resistance 220 is replaced with dummy resistances 221 and 222 that are connected in series with sense input nodes Nsi and /Nsi, respectively.

Via connection switching circuit 210, dummy resistance 221 is connected in series with the selected memory cell, and dummy resistance 222 is connected in series with dummy memory cell DMC#, regardless of the address selection result. Otherwise, the configuration of the second modification of the second embodiment is the same as that of the second embodiment, and thus, detailed description thereof is not repeated.

The electric resistances of dummy resistances 221 and 222 are set such that the combined resistance of dummy memory cell DMC# and resistance adjusting portion 202 (dummy resistance 222) attains an intermediate level between the two kinds of electric resistances corresponding to the combined resistances of the two kinds of electric resistances (Rmax, Rmin) of the selected memory cell and resistance adjusting portion 202 (dummy resistance 221). For example, in the case where the electric resistance of the dummy memory cell is set to Rmin, if the electric resistances of dummy resistances 221 and 222 are set to ΔR/2 and ΔR, respectively, then the above condition can be satisfied according to the following expression (1).

$$R\text{min}+\Delta R/2 < R\text{min}+\Delta R < R\text{max}+\Delta R/2 \qquad (1)$$

FIG. 11 shows, by way of example, configurations of dummy resistances 221 and 222 designed as described above. Dummy resistance 221 is formed of MOS transistors 223 and 224 connected in parallel with each other. Dummy resistance 222 is formed of half the number of field effect transistors of dummy resistance 221, i.e., one field effect transistor. Transistors 222–224 each have a gate receiving common control voltage Vrd. Thus, it is possible to set the electric resistance of dummy resistance 221 to one-half the electric resistance of dummy resistance 222. That is, by adjusting control voltage Vrd such that the electric resistance of dummy resistance 222 becomes ΔR, correspondingly, the electric resistance of dummy resistance 221 can be set to ΔR/2. Therefore, the same effects as in the second embodiment can also be enjoyed with this configuration.

Figure 18:
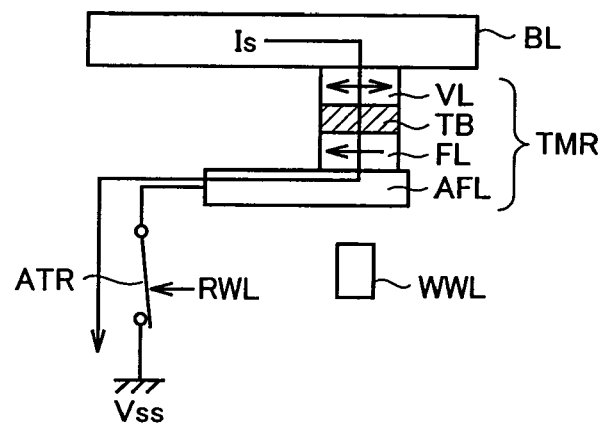
FIG. 18 is a conceptual diagram illustrating a data read operation from the MTJ memory cell.
Figure 19:
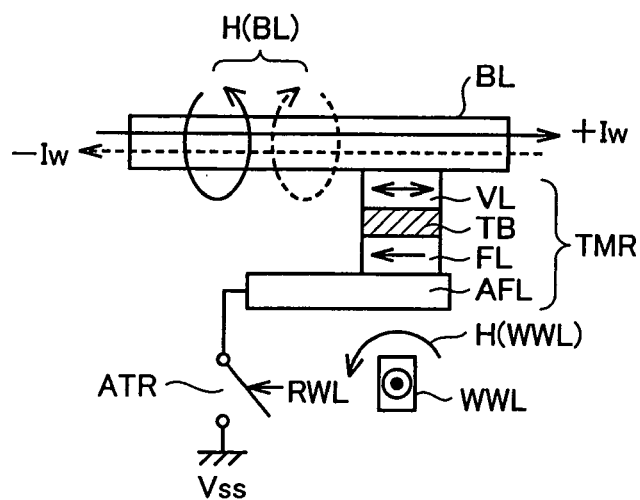
FIG. 19 is a conceptual diagram illustrating a data write operation to the MTJ memory cell.
Figure 20:
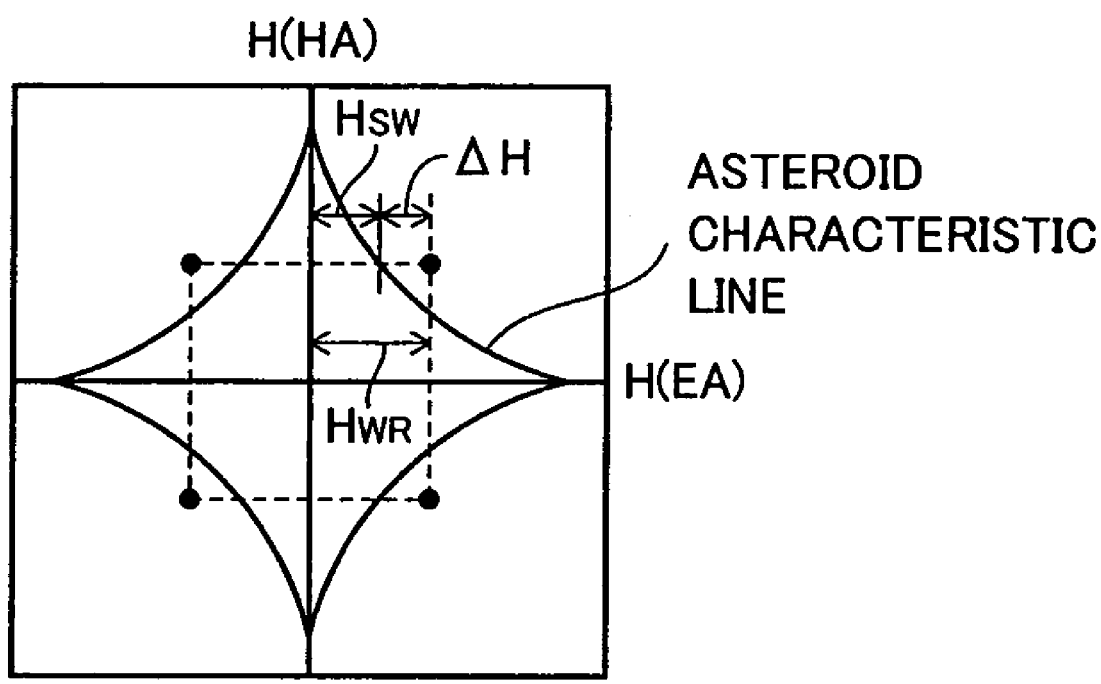
FIG. 20 is a conceptual diagram illustrating a relation between a data write current at the time of data write to the MTJ memory cell and a magnetization direction of the tunneling magneto-resistance element.

In the second embodiment and its modifications (shown in FIGS. 8, 10 and 11), the case where the electric resistance of the dummy memory cell is preset to Rmin has been described. This is because, in the manufacturing process of the MRAM device, after completion of the magnetizing step of fixed magnetic layer FL shown in FIG. 18 being carried out following fabrication of memory array 10, the magnetization directions of fixed magnetic layer FL and free magnetic layer VL become the same, and thus the dummy memory cell attains the electric resistance of Rmin. If the electric resistance of dummy memory cell DMC# is to be set to Rmax, an additional magnetizing step dedicated thereto will be necessary. In other words, by setting the electric resistance of dummy memory cell DMC# to Rmin, such an additional magnetizing step exclusively for the dummy memory cells becomes unnecessary.

However, the configurations shown in the second embodiment and its modifications are also applicable to the case where the electric resistance of dummy memory cell DMC# is preset to Rmax. In such a case, all that is need in the configurations shown in FIGS. 8 and 10 is to connect dummy resistance 220 to the other sense input node, and all that is need in the configuration in FIG. 11 is to replace dummy resistances 221 and 222 with each other. By doing so, the data read can be carried out in the same manner as described above.

Third Embodiment

In the third embodiment of the present invention, an efficient way to replace dummy memory cells in the memory array configuration in which dummy memory cells DMC as in the first embodiment are arranged to form a dummy memory cell column is explained.

Figure 12:
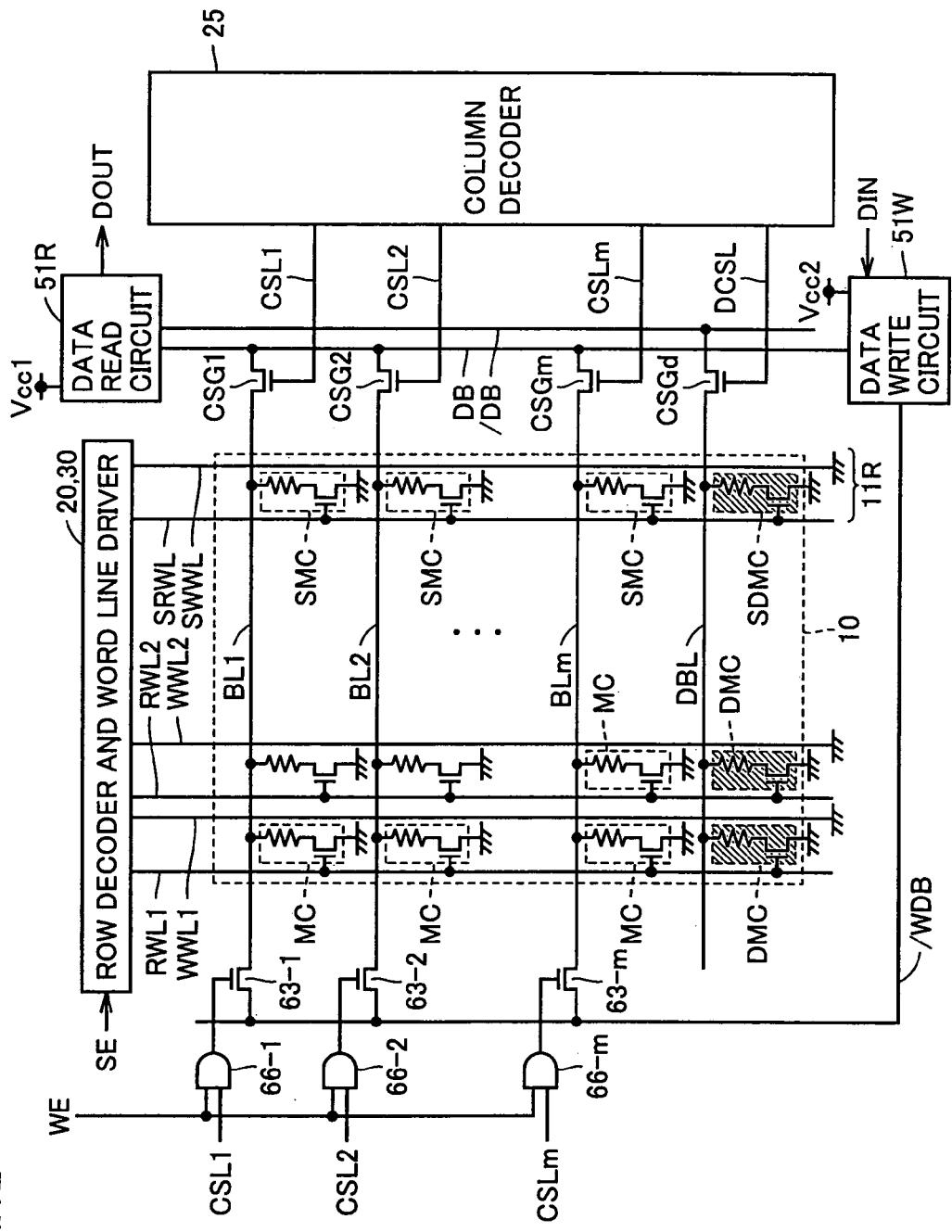
FIGS. 12 and 13 are circuit diagrams showing memory array configurations according to third and fourth embodiments, respectively, of the present invention.

Referring to FIG. 12, in the configuration according to the third embodiment, m normal memory cell columns and a dummy memory cell column are arranged separately. Bit lines BL1–BLm and a dummy bit line DBL are arranged corresponding to the m normal memory cell columns and the dummy memory cell column, respectively.

Normal memory cells MC and dummy memory cells DMC are arranged to share memory cell rows. That is, row selection of normal memory cells MC and dummy memory cells DMC are carried out using common read word lines RWL and write word lines WWL.

Further, a redundant row 11R is arranged for replacement/repair of defects in normal memory cells MC and dummy memory cells DMC. Redundant row 11R has spare memory cells SMC and a spare dummy memory cell SDMC arranged along the row direction. In each normal memory cell column, spare memory cell SMC is connected to bit line BL. In the dummy memory cell column, spare dummy memory cell SDMC is connected to dummy bit line DBL. Spare read word line SRWL and spare write word line SWWL are arranged corresponding to redundant row 11R for selection of redundant row 11R in the data read and data write operations, respectively. Each gate of spare memory cells SMC and spare dummy memory cell SDMC is connected to spare read word line SRWL.

In the configuration according to the third embodiment, defects in the normal memory cells and dummy memory cells are replaced in a unit of memory cell row. That is, if a defective row having defects in at least one of normal memory cells MC and dummy memory cells DMC is selected as an access target, redundant row 11R is designated to be accessed instead of the relevant selected row. Specifically, spare read word line SRWL (at the time of data read) or spare write word line SWWL (at the time of data write) is activated instead of read word line RWL or write word line WWL of the defective row. As a result, in the data read operation where a defective row is selected, spare memory cell SMC and spare dummy memory cell SDMC are connected to bit line BL of the selected column and dummy bit line DBL, respectively, and the data read as described in conjunction with FIG. 2 is carried out.

Further, by arranging inverse write data bus /WDB, transistor switches 63-1 to 63-m and control gates 66-1 to 66-m as in FIG. 5, in the data write operation where a defective row is selected, it is possible to make data write currents flow through bit line BL of the selected column and spare write word line SWWL, so that data can be written into relevant spare memory cell SMC instead of the selected memory cell.

As described above, in the configuration according to the third embodiment, the direction in which dummy memory cells DMC are arranged (column direction) and the direction in which spare memory cells SMC and spare dummy memory cell SDMC are arranged (row direction) are different from each other. Thus, it is possible to replace/repair defects not only in normal memory cells MC but also in dummy memory cells DMC in a unit of memory cell row using redundant row 11R including both spare memory cells SMC and spare dummy memory cell SDMC.

In other words, if replacement/repair is to be done in a unit of memory cell column in the memory array configuration having a dummy memory cell column formed therein, it would be necessary to provide separate redundant columns for spare memory cells SMC and spare dummy memory cell SDMC and also provide separate signal interconnections for selection of the respective redundant columns. However, according to the present embodiment, replacement/repair of both normal memory cells MC and dummy memory cells DMC are possible using redundant row 11R. Therefore, reduction of layout area of spare memory cells SMC and spare dummy memory cell SDMC, and hence downsizing of the memory array becomes possible.

Fourth Embodiment

In the fourth embodiment of the present invention, a redundancy repair configuration in the memory array configuration where dummy memory cells DMC# each having the same configuration as normal memory cell MC are arranged to form a dummy memory cell column is explained.

Figure 13:
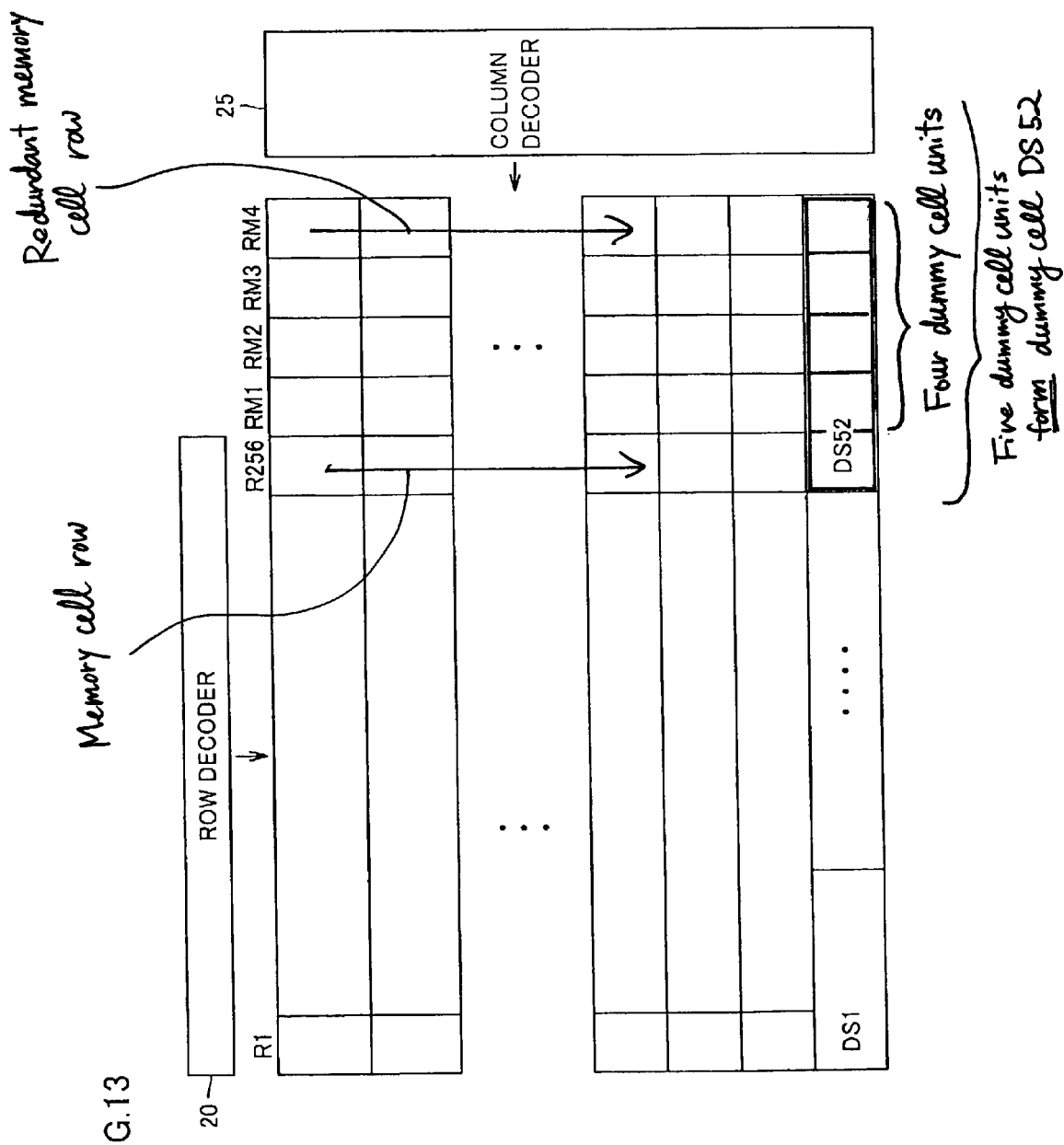

Referring to FIG. 13, in the configuration according to the fourth embodiment, dummy memory cells DMC# are arranged to form a dummy memory cell column, instead of dummy memory cells DMC in the memory array configuration shown in FIG. 12. Dummy memory cell DMG# is as described above in conjunction with FIG. 8, so that detailed description thereof is not repeated. Specifically, dummy memory cell DMC# is magnetized in advance in a direction to have a prescribed electric resistance of, e.g., Rmin.

Bit lines BL1–BLm and dummy bit line DBL corresponding to m normal memory cell columns and the dummy memory cell column, data buses DB, /DB, inverse write data bus /WDB, transistor switches 63-1 to 63-m and control gates 66-1 to 66-m are arranged in the same manner as in FIG. 12.

Further, dummy resistance 220 shown in FIG. 8 is connected in series with data bus /DB such that data read can be performed with reference to the dummy memory cells having the same characteristics as normal memory cell MC. In the memory array configuration shown in FIG. 13, data buses DB and /DB are connected fixedly to a selected memory cell and a dummy memory cell in the data read operation, regardless of a result of row selection. Thus, provision of connection switching circuit 210 is unnecessary.

Next, a redundancy repair method in the configuration according to the fourth embodiment is described.

In the configuration of the fourth embodiment, a redundant column 11C is further arranged, instead of redundant row 11R in FIG. 12. The redundant column 11C is used commonly for replacement/repair of the normal memory cells and the dummy memory cells. Redundant column 11C has a plurality of spare memory cells SMC provided along the column direction corresponding to the respective memory cell rows. As described above, each spare memory cell SMC has the same configuration and shape as normal memory cell MC.

Spare memory cells SMC are selected by read word lines RWL and write word lines WWL shared with normal memory cells MC and dummy memory cells DMC. Each spare memory cell SMC is connected to spare bit line SBL provided corresponding to redundant column 11C.

Spare bit line SBL is connected to data bus DB via spare column select gate SCSG and connected to data bus /DB via spare dummy column select gate SDCG. Spare column select gate SCSG turns on in response to activation (to an H level) of spare column select line SCSL. Spare dummy column select gate SDCG turns on in response to activation (to an H level) of spare dummy column select line SDCSL.

In the configuration according to the fourth embodiment, as in the configuration of the second embodiment, presence/absence of defects in normal memory cells MC (corresponding to redundant row activating signal ACT(n) shown in FIG. 9), a defective address indicating the memory cell column including a defective memory cell (corresponding to defective address FAD(n) in FIG. 9), and presence/absence of defects in the dummy memory cell column (corresponding to redundant row activating signal ACT(d) in FIG. 9) are programmed in the program circuit.

The redundancy control circuit generates spare column enable signal SCE and spare dummy column enable signal SDCE (not shown), instead of spare row enable signal SRE and spare dummy row enable signal SDRE shown in FIG. 9. Spare column enable signal SCE is set to an H level when column address CA matches a defective address, and otherwise inactivated to an L level. Spare dummy column enable signal SDCE is activated to an H level when there is a defect in dummy memory cells DMC# and thus the dummy memory cell column needs to be replaced. In the case where replacement/repair of dummy memory cells DMC# by spare memory cells SMC is programmed, stored data corresponding to a prescribed electric resistance (Rmin) of dummy memory cell DMC# is written in advance to each spare memory cell SMC.

Column decoder 25 selectively activates (to an H level) column select lines CSL1–CSLm, dummy column select line DCSL and spare dummy column select line SDCSL, based on column address CA as well as spare column enable signal SCE and spare dummy column enable signal SDCE from the redundancy control circuit.

Specifically, when a normal memory cell column including defect(s) is being replaced, i.e., when spare column enable signal SCE is activated, spare column select line SCSL is activated, instead of the column select line of the selected column, in each of the data read and data write operations.

On the contrary, when the dummy memory cell column including defect(s) is being replaced, i.e., spare dummy column enable signal SDCE is activated, spare dummy column select line SDCSL is activated in the data read operation, instead of the column select line of the selected column. In the data write operation, the column select line of the selected column is activated (to an H level) based on column address CA, since it is unnecessary to access dummy memory cell DMC.

By adoption of the redundancy determination method as described above, if there is a defect in dummy memory cells DMC#, spare memory cell SMC which is to replace the defective dummy memory cell is connected to data bus /DB in the data read operation. If there is a defect in normal memory cells MC, spare memory cell SMC which is to replace the relevant defective memory cell is connected to data bus DB in each of the data write and data read operations.

Accordingly, in the memory array configuration where dummy memory cells DMC# each having the same configuration as the normal memory cell are arranged to form a dummy memory cell column, it is possible to replace/repair defects in both normal memory cells MC and dummy memory cells DMC# by commonly using spare memory cells SMC that are efficiently arranged to form a redundant column.

The same effects can be enjoyed in the configuration where dummy resistance 220 connected in series with data bus /DB is replaced with dummy resistance 220 connected in parallel with data bus DB as in FIG. 10, and also in the configuration where dummy resistances 221 and 222 are connected in series with data buses DB and /DB, respectively, as in FIG. 11. Further, each dummy memory cell DMC# may be magnetized in advance to have electric resistance Rmax by reversing connections between the dummy resistance(s) and data buses DB, /DB, as explained in conjunction with the second embodiment.

Fifth Embodiment

In the fifth embodiment, a repair method of defective columns based on a shift column redundant configuration is described.

Figure 14:
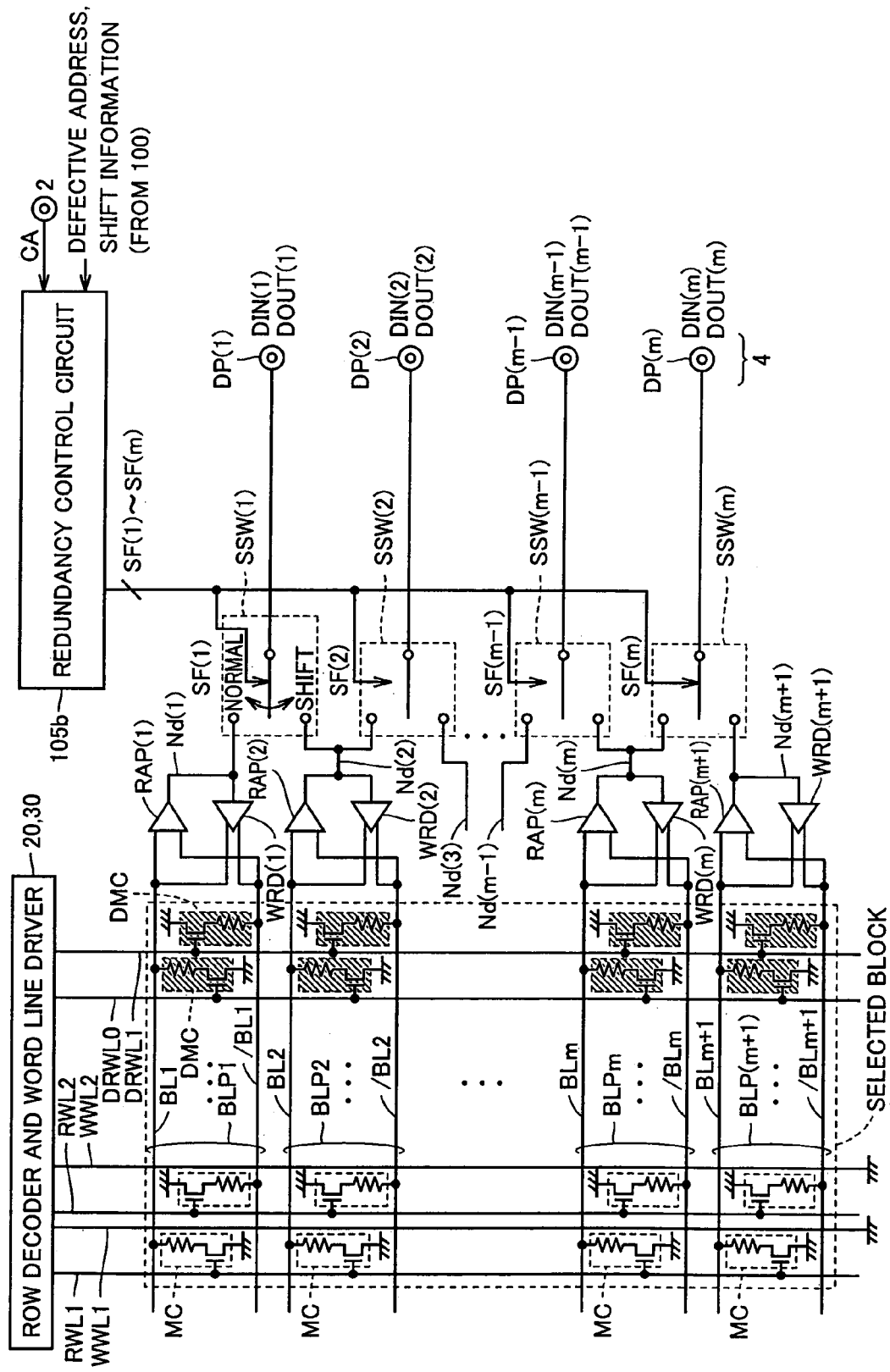
FIG. 14 is a circuit diagram showing a memory array configuration and a configuration for reading data from and writing data to the memory array according to a fifth embodiment of the present invention.

Referring to FIG. 14, it is assumed in the configuration according to the fifth embodiment that data of m bits (m is a natural number) are to be read or written in parallel. Write data DIN(1)–DIN(m) and DOUT(1)–DOUT(m) to be input/output in parallel are sent to and received from the outside of the MRAM device, via data input/output terminals DP(1)–DP(m) also collectively referred to as data terminal 4.

Although the entire configuration is not shown, memory array 10 is divided into a plurality of blocks each performing read or write of m bits of data. Each block has (m+1) memory cell columns, and bit line pairs BLP1–BLP(m+1) are provided corresponding to the (m+1) memory cell columns. Each of bit line pairs BLP1–BLP(m+1) is formed of complementary bit lines BL and /BL.

In each memory cell column, normal memory cells MC and dummy memory cells DMC in alternate rows are connected to complementary bit lines BL and /BL, as in the configuration shown in FIG. 2. Further, although not shown, transistor switch 62 and control gate 66 as in FIG. 2 are arranged corresponding to each memory cell column on one ends of bit lines BL and /BL. Thus, in each memory cell column of a selected block, bit lines BL and /BL are connected to one and the other of the selected memory cell and dummy memory cell DMC in the data read operation, and the relevant ends of bit lines BL and /BL are connected to each other by the transistor switch (not shown) in the data write operation.

In FIG. 14, only a selected block is shown representatively. In each block, when selected, data read and data write are carried out as explained below.

To realize so-called "shift redundancy" in a unit of memory cell column, data nodes Nd(1)–Nd(m+1), read amplifiers RAP(1)–RAP(m+1) and write drivers WRD(1)–WRD(m+1) are commonly provided for the (m+1) memory cell columns in the respective blocks. Hereinafter, data nodes Nd(1)–Nd(m+1), read amplifiers RAP(1)–RAP(m+1) and write drivers WRD(1)–WRD(m+1) are also collectively referred to as data node Nd, read amplifier RAP and write driver WRD, respectively.

Each read amplifier RAP supplies a sense current to corresponding bit lines BL and /BL in a selected block, and generates and provides read data according to the voltage difference between the relevant bit lines BL and /BL to corresponding data node Nd.

Each write driver WRD, when write data is transmitted to corresponding data node Nd via corresponding one of shift switches SSW(1)–SSW(m), drives corresponding bit lines BL and /BL to one and the other of an H level (power supply voltage Vcc2) and an L level (ground voltage Vss) according to the write data. As a result, data write currents in the directions according to the transmitted stored data are applied to corresponding bit lines BL and /BL. On the contrary, when write data is not transmitted to corresponding data node Nd, write driver WRD drives both of corresponding bit lines BL and /BL to an L level (ground voltage Vss). Thus, data write currents are not applied to the relevant bit lines BL and /BL.

The circuit group for use in the shift redundancy can be shared by a plurality of blocks, e.g., by arranging select switches (not shown) turning on/off according to a result of block selection between the (m+1) bit line pairs in the respective blocks and read amplifiers RAP(1)–RAP(m+1) and write drivers WRD(1)–WRD(m+1).

Shift switches SSW(1)–SSW(m) corresponding to data input/output terminals DP(1)–DP(m) are arranged sequentially between neighboring two data nodes Nd(1)–Nd(m+1). Each of shift switches SSW(1)–SSW(m) connects one of the corresponding two data nodes to corresponding one of data input/output terminals DP(1)–DP(m).

The connected directions of shift switches SSW(1)–SSW(m) are controlled by respective shift control signals SF(1)–SF(m) based on a redundancy determination result of redundancy control circuit 10. In the configuration according to the fifth embodiment, memory cell columns arranged in the respective blocks in a number of bits of data plus one, i.e., (m+1) memory cell columns are used to perform redundancy repair in a unit of memory cell column by means of shift redundancy wherein m memory cell columns are selected by skipping a defective column.

For example, the first shift switch SSW(1) selectively connects one of data nodes Nd(1) and Nd(2) to data input/output terminal DP(1) in accordance with shift control signal SF(1). The m-th (last) shift switch SSW(m) selectively connects one of data nodes Nd(m) and Nd(m+1) to data input/output terminal DP(m) in accordance with shift control signal SF(m). Hereinafter, shift switches SSW(1)–SSW(m) are also collectively referred to as shift switch SSW.

Each shift switch SSW has its connected direction changed according to which data node Nd corresponds to the memory cell column including a defect. For example, in the configuration shown in FIG. 14, if the j-th (j is a natural number from 2 to (m+1)) memory cell column includes a defective memory cell, the connected directions of shift switches SSW(1)–SSW(j−1) are set to a normal side (upper direction in FIG. 14), whereas the connected directions of shift switches SSW(j)–SSW(m) are set to a shift side (lower direction in FIG. 14). If the first memory cell column includes a defective memory cell, the connected directions of all shift switches SSW(1)–SSW(m) are set to the shift side (lower direction in FIG. 14).

On the other hand, if a defective memory cell does not exist in any memory cell column and hence shift redundancy is unnecessary, then the connected directions of all shift switches SSW(1)–SSW(m) are set to the normal side (upper direction in FIG. 14).

Figure 15:
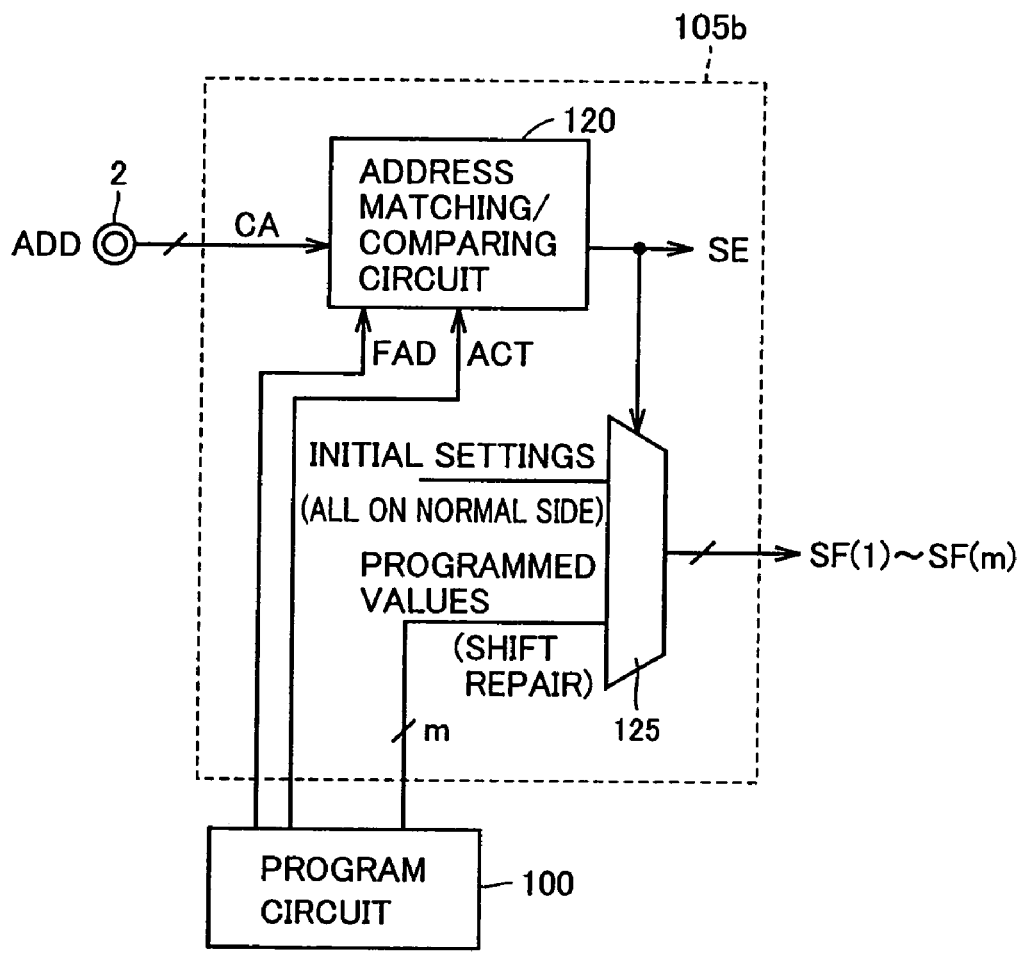
FIG. 15 is a block diagram showing a configuration of the redundancy control circuit shown in FIG. 14.

FIG. 15 is a circuit diagram showing a configuration of the redundancy control circuit according to the fifth embodiment.

Referring to FIG. 15, in the configuration according to the fifth embodiment, program circuit 100 stores, in a non-volatile manner, defective address FAD indicating the block including a defective column, and settings of shift control signals SF(1)–SF(m) for repairing the defective column by shift redundancy when the relevant block is selected. Shift control signals SF(1)–SF(m) are set in accordance with the position of the defective column as described above.

Redundancy control circuit 105b includes an address matching/comparing circuit 120 performing matching/comparison between defective address FAD from program circuit 100 and an address ADD (information of block selection) input to address terminal 2, and a selector 125. Address matching/comparing circuit 120 activates spare enable signal SE to an H level when defective address FAD matches address signal ADD, i.e., the selected block includes the defective column; otherwise, it inactivates spare enable signal SE to an L level.

Selector 125, when spare enable signal SE is activated to an H level, sets shift control signals SF(1)–SF(m) based on the programmed values in program circuit 100. On the other hand, when spare enable signal SE is inactivated to an L level, i.e., when the selected block does not include a defective column, shift control signals SF(1)–SF(m) are set to connect each shift switch SSW to the normal side.

With the configuration as described above, replacement/repair of defects in both normal memory cells MC and dummy memory cells DMC becomes possible in each block in a unit of memory cell column, by means of shift redundancy employing the memory cell columns provided with an extra column. Although the redundant configuration applying shift redundancy to the memory cell configuration as in FIG. 2 has been illustrated in FIG. 14, the shift redundancy is also applicable to the memory cell configurations as shown in FIGS. 5–7.

Sixth Embodiment

In the sixth embodiment of the present invention, a test configuration for detecting defects in dummy memory cells DMC (DMC#) having been explained as the objects to be replaced in the first through fifth embodiments, is described.

Figure 16:
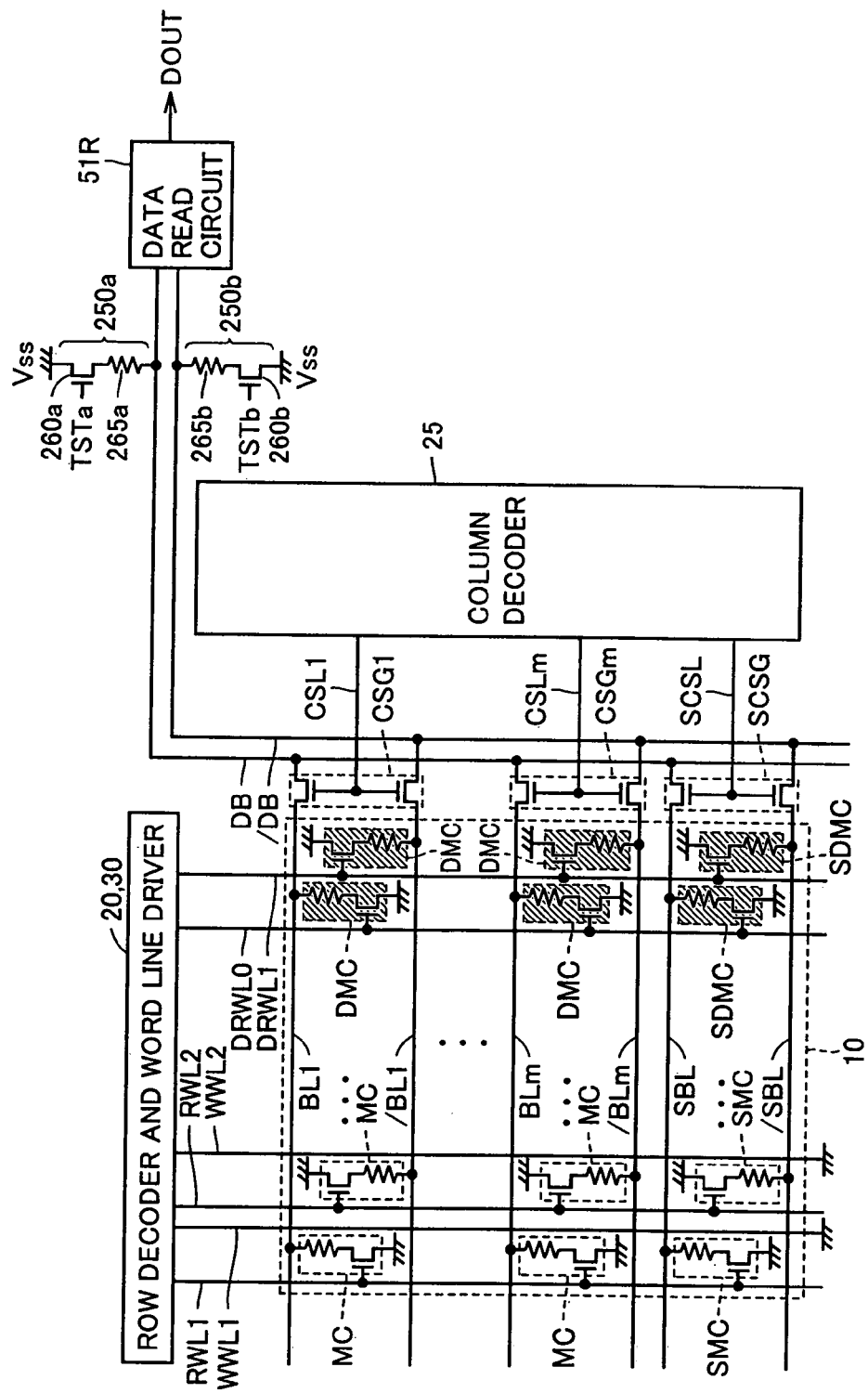
FIG. 16 is a circuit diagram showing a test circuit of dummy memory cells according to a sixth embodiment of the present invention.

FIG. 16 is a circuit diagram showing a test circuit of dummy memory cells according to the sixth embodiment.

Referring to FIG. 16, memory cell array 10 has the same configuration as in FIG. 2. Accordingly, in a normal data read operation, read word line RWL of a selected row, dummy read word line DRWL0 or DRWL1 and column select line CSL of a selected column are activated in accordance with the results of row and column selections, and thus, the selected memory cell (normal memory cell MC) and dummy memory cell DMC are connected to one and the other of data buses DB and /DB.

In the configuration according to the sixth embodiment, dummy reference potential generating circuits 250a and 250b are provided corresponding to data buses DB and /DB, respectively, for detecting defects in dummy memory cells DMC.

Dummy reference potential generating circuit 250a includes a test switch 260a and a test resistance 265a which are connected in series between data bus DB and ground voltage Vss. Test switch 260a is formed of a MOS transistor having a gate receiving a test signal TSTa. Dummy reference potential generating circuit 250a is designed such that a sum of electric resistances of test switch 260a and test resistance 265a at the time of activation of test signal TSTa attains a level suitable for the defect detecting test of dummy memory cells.

Dummy reference potential generating circuit 250b, designed the same as dummy reference potential generating circuit 250a, includes a test switch 260b and a test resistance 265b that are connected in series between data bus /DB and ground voltage Vss.

In a test mode where detection of defects in dummy memory cells DMC is being conducted, read word lines RWL and write word lines WWL are all inactivated, and one of dummy read word lines DRWL0 and DRWL1 is activated. In response, one of data buses DB and /DB is pulled down to ground voltage Vss via dummy memory cell DMC. Further, one of test signals TSTa and TSTb is activated such that the other of data buses DB and /DB is pulled down to the ground voltage via test resistance 265a or 265b.

With the configuration as described above, by designing such that electric resistances of dummy reference potential generating circuits 250a and 250b on activation of test signals TSTa and TSTb become a prescribed electric resistance of the normal memory cell, i.e., Rmax or Rmin, for example, it is possible to make a voltage in accordance with the electric resistance of the dummy memory cell to be tested and a testing reference potential by dummy reference potential generating circuits 250a, 250b occur in one and the other of data buses DB and /DB. That is, the testing reference potential is designed to have a level different from the potential that should be occurred to data buses DB, /DB by dummy memory cell DMC having an electric resistance as originally designed.

Accordingly, the defects in dummy memory cells DMC can be detected based on the read data DOUT that is generated by data read circuit 51R by comparing the voltages of data buses DB and /DB. Specifically, a defect in dummy memory cell DMC can be detected according to whether the relevant read data DOUT has a polarity in accordance with the relation in magnitude between the electric resistance of dummy reference potential generating circuits 250a, 250b and a prescribed resistance level (Rmin+ ΔR/2) of dummy memory cell DMC.

The test configuration of the dummy memory cells according to the sixth embodiment is applicable unlimited to any particular configuration of memory array 10. The same effects as described above can be enjoyed as long as there is a data line connectable to dummy memory cells DMC in a test mode, by providing dummy reference potential generating circuits 250a, 250b shown in FIG. 16 as a comparison target of the relevant data line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
   a matrix including:
   a plurality of memory cells aligned in a first direction, each memory cell having an electric resistance in accordance with magnetically written data;
   a plurality of dummy memory cells aligned in the first direction, each having a prescribed electric resistance;
   a plurality of redundant memory cells aligned in a second direction, including a first spare memory cell for replacement of any of the memory cells, and a second spare memory cell for replacement of any of the dummy memory cells; and
   a data read circuit performing data read based on an electric resistance difference between selected one of said plurality of memory cells and one of said plurality of dummy memory cells, wherein
   the plurality of memory cells and the first spare memory cell form a row or a column of the matrix,
   the plurality of dummy memory cells and the second spare memory cell form another row or column of the matrix,
   said plurality of dummy memory cells are arranged to form at least one row, and
   said plurality of dummy memory cells are selectively connected to said data read circuit based on a result of column selection.

2. A thin film magnetic memory device, comprising:
   a matrix including:
   a plurality of memory cells aligned in a first direction, each memory cell having an electric resistance in accordance with magnetically written data;
   a plurality of dummy memory cells aligned in the first direction, each having a prescribed electric resistance;
   a plurality of redundant memory cells aligned in a second direction, including a first spare memory cell for replacement of any of the memory cells, and a second spare memory cell for replacement of any of the dummy memory cells; and
   a data read circuit performing data read based on an electric resistance difference between selected one of said plurality of memory cells and one of said plurality of dummy memory cells, wherein
   the plurality of memory cells and the first spare memory cell form a row or a column of the matrix,
   the plurality of dummy memory cells and the second spare memory cell form another row or column of the matrix,
   said plurality of dummy memory cells are arranged to form at least one column, and
   said plurality of dummy memory cells are selectively connected to said data read circuit based on a result of row selection.

3. A thin film magnetic memory device, comprising:
   a matrix including
   a plurality of memory cells aligned in a first direction, each memory cell having an electric resistance in accordance with magnetically written data,
   a plurality of dummy memory cells aligned in the first direction, each having a prescribed electric resistance,
   a plurality of redundant memory cells aligned in a second direction, including a first spare memory cell for replacement of any of the memory cells, and a second spare memory cell for replacement of any of the dummy memory cells; and
   a data read circuit performing data read based on an electric resistance difference between selected one of said plurality of memory cells and one of said plurality of dummy memory cells, wherein
   the plurality of memory cells and the first spare memory cell form a first row of the matrix,
   the plurality of dummy memory cells and the second spare memory cell form a second row of the matrix,
   the matrix includes a plurality of the first rows and at least one second row,
   the thin film magnetic memory device further comprising:
   a plurality of first signal lines provided corresponding to the first rows each including the memory cells and the first spare memory cell, and used for selection of said first rows; and
   at least one second signal line provided corresponding to the at least one second row and used for selection of said at least one second row;
   the row selection for the first spare memory cells in the respective first rows being conducted via said plurality of first signal lines, and
   the row selection for the second spare memory cell in the at least one second row being conducted via said at least one second signal line.

4. A thin film magnetic memory device, comprising:
   a matrix including
   a plurality of memory cells aligned in a first direction, each memory cell having an electric resistance in accordance with magnetically written data,
   a plurality of dummy memory cells aligned in the first direction, each having a prescribed electric resistance,
   a plurality of redundant memory cells aligned in a second direction, including a first spare memory cell for replacement of any of the memory cells, and a second spare memory cell for replacement of any of the dummy memory cells; and a data read circuit performing data read based on an electric resistance difference between selected one of said plurality of memory cells and one of said plurality of dummy memory cells, wherein the plurality of memory cells and the first spare memory cell form a first column of the matrix, the plurality of dummy memory cells and the second spare memory cell form a second column of the matrix, the matrix includes a plurality of the first columns and at least one second column, the thin film magnetic memory device further comprising:

a plurality of bit lines provided corresponding to the first columns each including the memory cells and the first spare memory cell; and a dummy bit line provided corresponding to the second column of said plurality of dummy memory cells and the second spare memory cell;

in each first column, corresponding memory cells and corresponding first spare memory cell being connected to corresponding one of said plurality of bit lines, and in the second column, said plurality of dummy memory cells and said second spare memory cell being connected to said dummy bit line.

* * * * *